United States Patent
Nagatomo

(10) Patent No.: US 7,145,803 B2
(45) Date of Patent: Dec. 5, 2006

(54) SEMICONDUCTOR MEMORY DEVICE

(75) Inventor: Masahiko Nagatomo, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 99 days.

(21) Appl. No.: 11/000,069

(22) Filed: Dec. 1, 2004

(65) Prior Publication Data
US 2005/0190604 A1    Sep. 1, 2005

(30) Foreign Application Priority Data
Feb. 26, 2004  (JP) .............................. 2004-051274

(51) Int. Cl.
G11C 11/34 (2006.01)
(52) U.S. Cl. .............. 365/185.23; 365/194; 365/230.06
(58) Field of Classification Search ........... 365/185.23, 365/194, 230.06
See application file for complete search history.

(56) References Cited

U.S. PATENT DOCUMENTS 6,157,983 A * 12/2000 Lee et al. .................. 711/103
6,243,297 B1    6/2001 Nagatomo
6,418,067 B1 *  7/2002 Watanabe et al. ........... 365/200

FOREIGN PATENT DOCUMENTS

JP    2000-331486    11/2000

* cited by examiner

Primary Examiner—Tuan T. Nguyen
Assistant Examiner—N Nguyen
(74) Attorney, Agent, or Firm—Nixon Peabody LLP; Donald R. Strudebaker

(57) ABSTRACT

A semiconductor memory device includes word lines, drain lines, source lines, a memory array including plural memory cells formed from a field effect transistor, a data write circuit, a write control circuit, and a word line drive circuit, wherein the write control circuit outputs the drain drive voltage of H-level to the selected memory cell when a data write operation is commanded, and outputs the drain drive voltage of L-level when a data write operation is not commanded, and the data write circuit generates a write voltage corresponding to a logical value of data to be written into the selected memory cell based on the drain drive voltage outputted from the write control circuit, and supplies the write voltage as the source drive voltage via the source line to the selected memory cell when a data write operation is commanded by the first control signal.

9 Claims, 15 Drawing Sheets

SEMICONDUCTOR MEMORY DEVICE

BACKGROUND OF THE INVENTION

1. Field of the Invention

The present invention relates to a semiconductor memory device such as a non-volatile memory (e.g., an EPROM) which allows electrical write.

2. Description of the Related Art

FIG. 16 is a diagram schematically showing the construction of a conventional EPROM. See Japanese Patent Kokai (Laid-Open) Publication No. 2000-331486, for example. Further, FIG. 17 is a diagram schematically showing the construction of four memory cells in the EPROM of FIG. 16. Furthermore, FIGS. 18 and 19 are diagrams for describing the problems in the EPROM of FIG. 16.

The EPROM shown in FIG. 16 has memory arrays $10_0, \ldots, 10_n$ provided with plural memory cells 11 (in distinguishing and describing each, the symbols $11a$, $11b$, $11c$ and $11d$ are also used) formed in a semiconductor substrate. In the semiconductor substrate in which the memory arrays $10_0, \ldots, 10_n$ on are formed, plural word lines $WL_0, \ldots, WL_n$ are arranged mutually in parallel, plural drain lines $DL_0, \ldots, DL_y, DL_z$ are arranged intersecting perpendicularly with the word lines $WL_0, \ldots, WL_n$, and plural source lines $SL_0, \ldots, SL_y, SL_z$ are arranged intersecting perpendicularly with the word lines $WL_0, \ldots, WL_n$. As shown in FIG. 17, the memory cell 11 ($11a$, $11b$, $11c$ and $11d$) includes, for example, field effect transistors which have gates GA, drains $DR_a$, $DR_{bc}$ and $DR_d$, sources $SOU_{ab}$ and $SOU_{cd}$, and floating gates $FG_a$, $FG_b$, $FG_c$ and $FG_d$. The gates of the plural memory cells 11 are connected to one of the plural word lines $WL_0, \ldots, WL_n$. Each drain of the plural memory cells 11 is connected to one of the plural drain lines $DL_0, \ldots, DL_z$, and each source of the plural memory cells 11 is connected to one of the plural source lines $SL_0, \ldots, SL_z$. In addition, the actual EPROM has circuits such as an address decoder for generating decoded signals $DEC_0, \ldots, DEC_n$, and a sense amplifier to read the data stored in the memory cell, these not being shown in the figures.

In each of the memory arrays $10_0, \ldots, 10_n$, the drain lines $DL_0, \ldots, DL_y, DL_z$ are respectively connected via NMOS transistors $12_0, \ldots, 12_{y1}$ (or $12_{y2}$), $12_{z1}$ (or $12_{z2}$) to a write control line 13, to which a drain drive voltage (write control signal) MCD is supplied. In each of the memory arrays $10_0, \ldots, 10_n$, ON/OFF control of the even-numbered NMOS transistors $12_0, 12_2, \ldots, 12_{y1}, 12_{z1}$ is performed by even number selection signals $SE_0, \ldots, SE_n$, respectively, and ON/OFF control of the odd-numbered NMOS transistors $12_1, 12_3, \ldots, 12_{y2}, 12_{z2}$ is performed by odd number selection signals $SO_0, \ldots, SO_n$, respectively. Moreover, in each of the memory arrays $10_0, \ldots, 10_n$, the source lines $SL_0, \ldots, SL_y, SL_z$ are connected to the bit lines $BL_0, \ldots, BL_y, BL_z$ via the NMOS transistors $14_0, \ldots, 14_y, 14_z$ which are ON/OFF controlled by memory array selection signals $SS_0, \ldots, SS_n$.

The EPROM shown in FIG. 16 includes word line drive circuits $20_0, \ldots, 20_n$ which supply drive signals to each of the word lines $WL_0, \ldots, WL_n$, a write control circuit 30 which supplies the drain drive voltage MCD to the write control line 13, data write circuits $40_1$ and $40_2$ which supply data $BLA_1$ and $BLA_2$ (data supplied to the bit lines $BL_y$ and $BL_z$ are represented as $BLA_3$ and $BLA_4$, respectively) to the bit lines $BL_0, \ldots, BL_y, BL_z$ (the data write circuits $40_3$ and $40_4$ supply data $BLA_3$ and $BLA_4$ to the bit lines $BL_y$ and $BL_z$, respectively), and a delay circuit 50 which delays a reset signal RST and outputs the delayed reset signal as a reset signal $RST_1$. The input of the data write circuits $40_3$ and $40_4$ is a power supply voltage VCC which is at high level (H-level).

The word line drive circuits $20_0, \ldots, 20_n$ have mutually identical constructions. The word line drive circuits $20_0, \ldots, 20_n$ respectively generate and output word line selection signals (word line drive voltages) to be supplied to the word lines $WL_0, \ldots, WL_n$ in accordance with the decoded signals $DEC_0, \ldots, DEC_n$ supplied from the address decoder. When the decoded signals $DEC_0, \ldots, DEC_n$ are at low level (L-level) which represents "non-selection", the word line drive circuits $20_0, \ldots, 20_n$ output a ground voltage GND to the word lines $WL_0, \ldots, WL_n$ as a word line selection signal. When the decoded signals $DEC_0, \ldots, DEC_n$ are at H-level which represents "selection", the word line drive circuits $20_0, \ldots, 20_n$ function according to a program mode signal "~PGM" (in this specification, "~PGM" means "PGM" with an upper line (i.e., overline), and represents the inverse signal of the signal PGM. In the figures, "~PGM" is represented as "PGM" with an upper line. During data write, the word line drive circuits $20_0, \ldots, 20_n$ output a program voltage VPP (e.g., 10 V) to the word lines $WL_0, \ldots, WL_n$ as a word line selection signal, and during data read, output the power supply voltage VCC to the word lines $WL_0, \ldots, WL_n$ as a word line selection signal.

During data write, the reset signal RST inputted to the write control circuit 30 is at L-level, the drain drive voltage MCD outputted from the write control circuit 30 is determined by the program voltage VPP and the control voltage VR, and is a voltage VCC+2Vtn (where Vtn is a threshold voltage of the NMOS transistor, and is approximately 1 V). The reset signal RST is at H-level during data read. At this time, the drain drive voltage MCD outputted from the write control circuit 30 is the ground voltage GND.

The data write circuits $40_1$, $40_2$, $40_3$ and $40_4$ have mutually identical constructions. When the program mode signal ~PGM is caused to be L-level to perform a data write operation, the data write circuits $40_1$ and $40_2$ output the ground voltage GND or the write signals $BLA_1$ and $BLA_2$ of the power supply voltage VCC from a node N40 according to the L-level or H-level of input data $D_1$ and $D_2$. The data write circuits $40_1$, $40_2$, $40_3$ and $40_4$ are configured in such a way that when a data read operation is performed by the program mode signal ~PGM, the node N40 of the data write circuits $40_1$ and $40_2$ is in a high impedance state.

For example, the data write circuit $40_1$ includes an inverter 41 to which the input data $D_1$ is supplied, a NOR gate 42 which outputs the negative logical sum of the output signal of the inverter 41 and the program mode signal ~PGM, and a NOR gate 43 which outputs the negative logical sum of the output signal of the NOR gate 42 and the program mode signal ~PGM. The data write circuit $40_1$ also includes an NMOS transistor 44 which is connected between the node N40 and the ground voltage GND, and is controlled by the output signal of the NOR gate 43, an NMOS transistor 45 which is connected between the power supply voltage VCC and the node N40, and is controlled by the output signal of the NOR gate 42, and an NMOS transistor 46 which is connected between the node N40 and the ground voltage GND, and is controlled by the reset signal $RST_1$ outputted from the delay circuit 50.

The write signals $BLA_1$ and $BLA_2$ outputted from the data write circuit $40_1$ and $40_2$ are respectively supplied, for example, to the adjacent bit lines $BL_0$ and $BL_1$ via the transistors $60a$ and $60b$ selected by column selection signals $Y_0$ and $Y_1$.

When a logical value low (represented by 'L') is written as data into the memory cell 11 selected by the word line $WL_i$ (a subscript "i" is an integer from 0 to n) even number selection signal $SE_j$ or the odd number selection signal $SO_j$ (a subscript "j" is an integer from 0 to n), memory array selection signal $SS_j$, and column selection signal $Y_k$ (a subscript "k" is an integer greater than 0), the data $D_1$ inputted to the data write circuit 40, is at L-level. At this time, the gate voltage Vg of the memory cell 11 is 10 V, the drain voltage Vd is VCC+2Vtn (=6 V), and the source voltage Vs is 0 V. Therefore, in the memory cell 11, a large current $I_{a1}$ flows from the drain to the source (e.g., in FIG. 17, from the drain $DR_a$ to the source $SOU_{ab}$), and due to the avalanche hot carrier generated by this current, electrons are injected into the floating gate (e.g., in FIG. 17, the floating gate $FG_a$).

On the other hand, when a high logical value (represented by 'H') is written as data into the memory cell 11 selected by the word line $WL_j$, even number selection signal $SE_j$ or odd number selection signal $SO_j$, memory array selection signal $SS_j$ and column selection signal $Y_k$, the input data $D_2$ is at H-level. At this time, the gate voltage Vg of the memory cell 11 is 10 V and the drain voltage Vd is VCC−2Vtn (=3 V). Therefore, in the memory cell 11, only a relatively small current $I_{d1}$ flows from the drain to the source (e.g., in FIG. 17, from the drain $DR_d$ to the source $SOU_{cd}$), and electrons are not injected into the floating gate (e.g., in FIG. 17, the floating gate $FG_d$) because no avalanche hot carriers are generated.

In the aforesaid conventional EPROM, two adjacent bit lines $BL_k$ and $BL_{k+1}$ are selected simultaneously by the column selection signal $Y_k$. The data (e.g., data $BLA_1$ and $BLA_2$) outputted from the data write circuits (e.g., data write circuits $40_1$ and $40_2$) are written respectively into two memory cells 11 connected to the selected bit lines $BL_k$ and $BL_{k+1}$. In FIG. 16, the data $BLA_1$ and $BLA_2$ are written simultaneously into the memory cells 11a and 11d selected by the word line $WL_0$, even number selection signal $SE_0$, memory array selection signal $SS_0$, and the column selection signal $Y_0$, respectively. For example, if the memory cell $10_0$ is selected by the memory array selection signal $SS_0$, the word line $WL_0$ is selected by the word line drive circuit $20_n$, the bit lines $BL_0$ and $BL_1$ are selected by the column selection signal $Y_0$, and the drain lines $DL_0$ and $DL_2$ are selected by the even number selection signal $SE_0$, current flows from the drain line $DL_0$ via the memory cell 11a, source line $SL_0$, NMOS transistor $14_0$, and bit line $BL_0$. As a result, a charge accumulates in the floating gate of the memory cell 11a (when it has the logical value 'L'), or does not accumulate in it (when it has the logical value 'H'). Also, current flows from the drain line $DL_2$ via the memory cell 11d, source line $SL_1$, NMOS transistor 141, and bit line $BL_1$. As a result, a charge accumulates in the floating gate of the memory cell 11d (when it has the logical value 'L'), or does not accumulate in it (when it has the logical value 'H').

In the above-mentioned conventional EPROM, the program mode signal ⁻PGM inputted to the data write circuits $40_1$ and $40_2$ is at H-level, the outputs of the NOR gates 42 and 43 are at L-level, and then the NMOS transistors 44 and 45 are both OFF. As a result, the output (namely, the node N40) of the data write circuits $40_1$ and $40_2$ is in a high impedance state. At this time, a current path from the memory cells 11a, 11b, 11c and 11d to the ground voltage GND does not exist, so if the memory cells 11a, 11b, 11c and 11d are in the logical value 'H' state, as shown in FIG. 18, the drain lines $DL_0$, $DL_1$ and $DL_2$, the source lines $SL_0$ and $SL_1$, and the bit lines $BL_0$ and $BL_1$ go up to the drain drive voltage MCD, i.e., VCC+2Vtn, (=6 V) via the memory cells 11a, 11b, 11c and 11d, respectively.

Here, if the logical value 'L' is written into the memory cell 11a and the logical value 'H' is written into the memory cell 11d, the program mode signal ⁻PGM inputted to the data write circuits $40_1$ and $40_2$ is at L-level, the write signal $BLA_1$ outputted from the data write circuit 40, is at L-level, and the write signal $BLA_2$ outputted from the data write circuit $40_2$ is at H-level. Then, as shown in FIG. 19, the bit line $BL_0$ and source $SOU_{ab}$ are at ground voltage GND (=0 V), and the bit line $BL_1$ and source $SOU_{cd}$ are at a voltage VCC−Vtn (=3 V). At this time, as shown by the arrow $I_{a2}$, current flows from the drain $DR_a$ to the source $SOU_{ab}$ at GND voltage, electrons are injected into the floating gate $FG_a$ by an avalanche hot carrier, and the logical value 'L' is written into the memory cell 11a. Also, only a small current $I_{d2}$ flows from the drain $DR_d$ to the source $SOU_{cd}$ at the voltage VCC−Vtn, so electrons are not injected into the floating gate $FG_d$ by an avalanche hot carrier, and the logical value 'H' is written into the memory cell 11d.

However, before data write to the memory cells 11a and 11d shown in FIG. 19 (at a time shown in FIG. 18), when data write occurs, the charge (voltage VCC+2Vtn) stored in the bit line $BL_1$ and drain line $DL_1$ is discharged through the source line $SL_0$ and bit line $BL_0$ at GND level, e.g., via the memory cell 11b. Due to this discharge current (e.g., current $I_b$ in FIG. 19), electrons may be injected into the floating gate $FG_b$ of the memory cell 11b, and incorrect write of data to the memory cell 11b which is not selected, may arise. Moreover, if the threshold voltage Vt of the memory cell increases due to injection of electrons into the floating gate, an access delay may occur and the operating power supply voltage may change.

SUMMARY OF THE INVENTION

It is therefore an object of the present invention to provide a semiconductor memory device which does not cause incorrect data write or an access delay.

According to the present invention, a semiconductor memory device includes plural word lines; plural drain lines; plural source lines; a memory array including plural memory cells formed from a field effect transistor having a gate, a drain, a source and a floating gate, the gate of each of the plural memory cells being connected to any of the plural word lines, the drain of each of the plural memory cells being connected to any of the plural drain lines, the source of each of the plural memory cells being connected to any of the plural source lines; a data write circuit which receives a first control signal and write data and supplies a source drive voltage to the source line when data is written into the memory cell; a write control circuit which receives a second control signal supplied later than the first control signal and supplies a drain drive voltage based on the second control signal to the drain line when data is written into the memory cell; and a word line drive circuit which receives an address signal and the second control signal, and supplies a word line drive voltage based on the second control signal to the word line selected according to the address signal. The write control circuit outputs the drain drive voltage at a high level for data write via the drain line to the memory cell selected by the word line drive circuit when a data write operation is commanded by the second control signal, and outputs the drain drive voltage at a low level when a data write operation is not commanded by the control signal, and the data write circuit generates a write voltage corresponding to a logical value of data to be written into the selected memory cell based on the drain drive voltage outputted from the write control circuit, and supplies the write voltage as the source drive voltage via the source line to the selected memory cell when a data write operation is commanded by the first control signal.

According to the present invention, a second control signal which has a delayed timing with respect to a first control signal (program mode signal) which commands a data write operation, is supplied to a word line drive circuit and a control circuit, and a high level control voltage for data write generated by the write control circuit is supplied to a data write circuit. Hence, when the data to be written is supplied to the data write circuit, in a selected memory cell and another memory cell which is not selected, the voltage of the drain and source is essentially ground voltage. Subsequently, a high level selection signal for data write is outputted from the word line drive circuit by a second control signal, and a high level control voltage for data write is generated by the write control circuit, and supplied to the data write circuit. Therefore, a high voltage is no longer applied between the drain and source of memory cells into which data are not written, and the cause of incorrect writes and fluctuation in the threshold voltage of the memory cells is eliminated.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
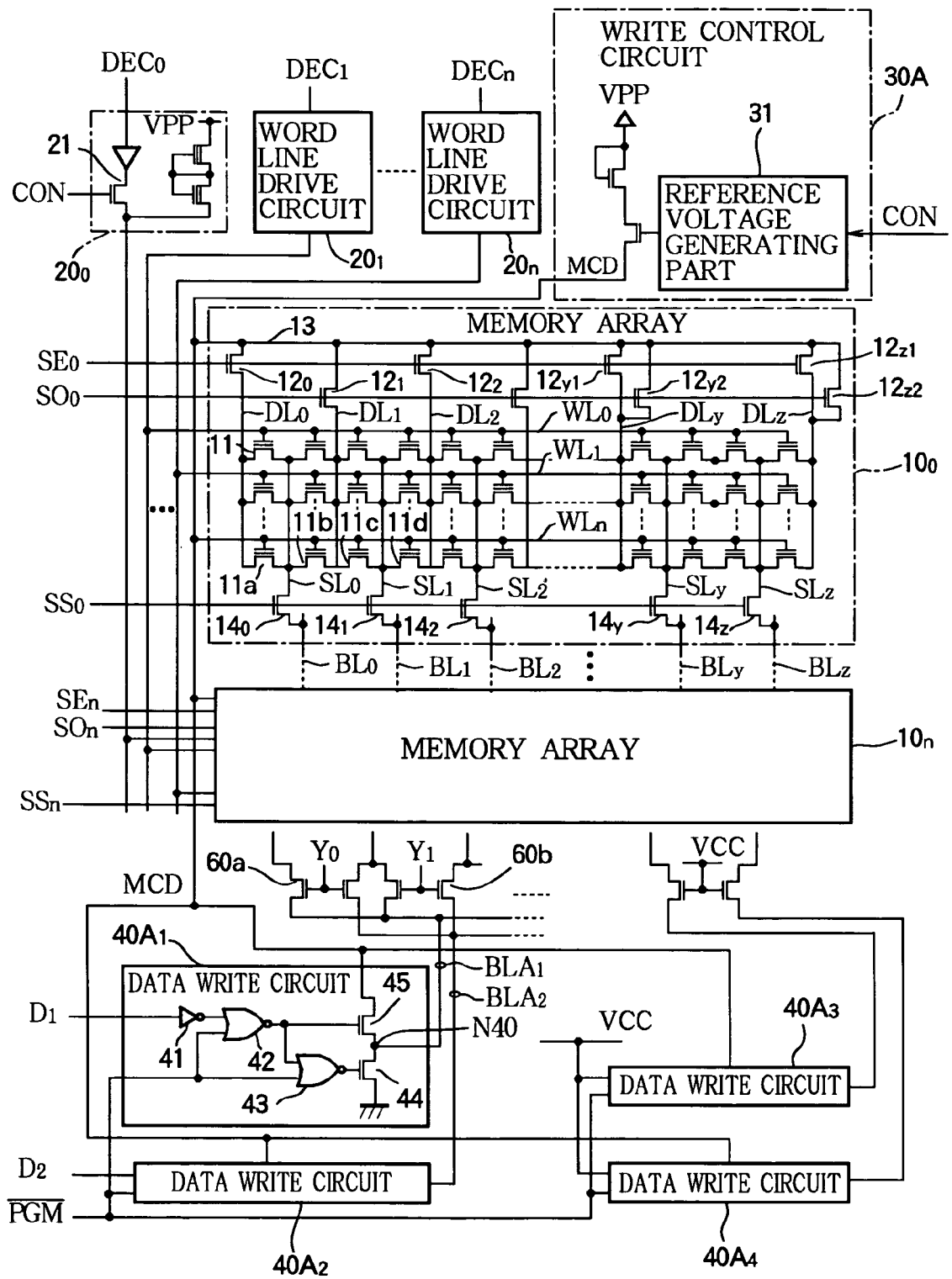
FIG. 1 is a diagram schematically showing the construction of an EPROM according to a first embodiment of the present invention.
Figure 2:
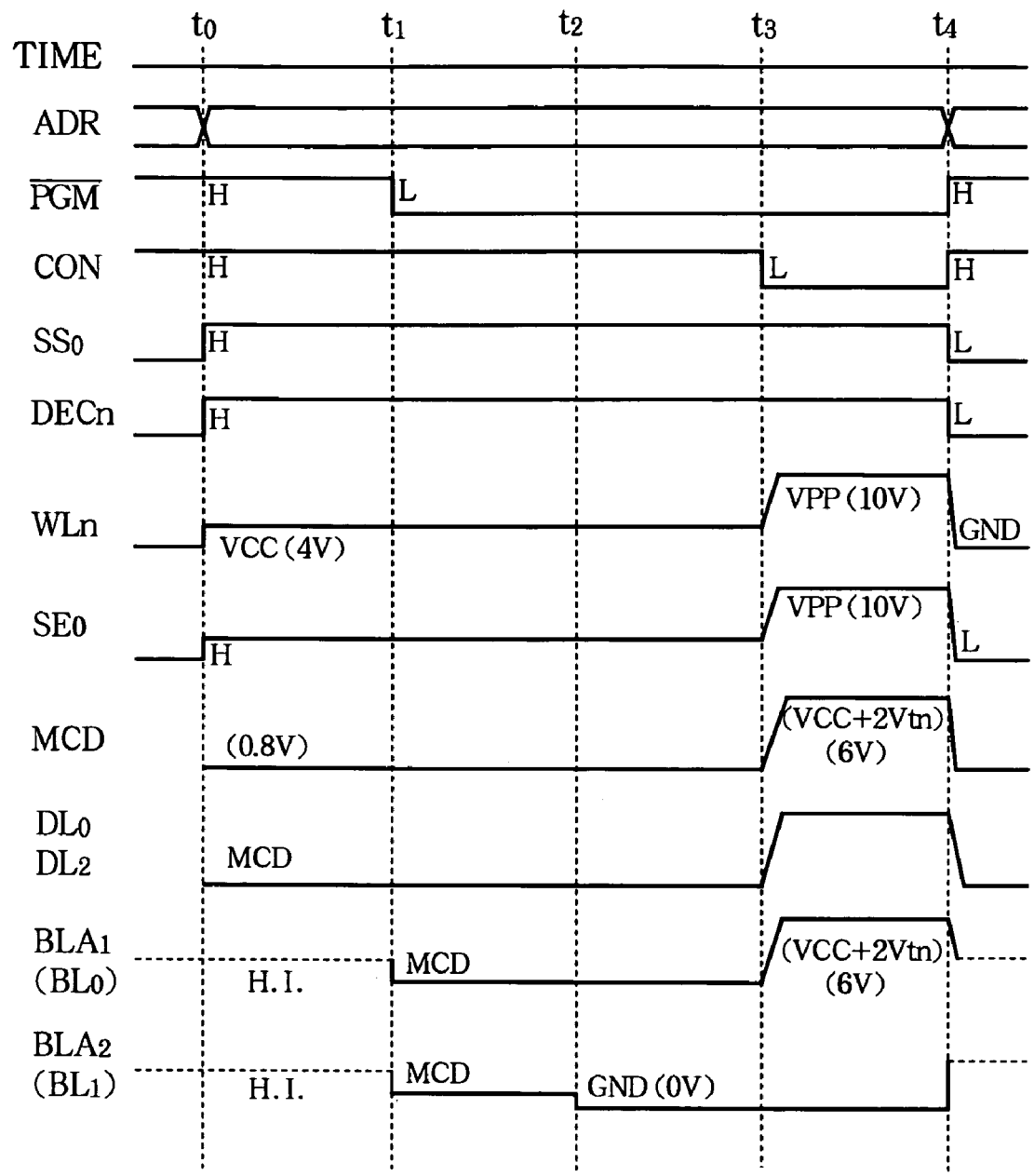
FIG. 2 is a signal waveform diagram for describing a data write operation of the EPROM according to the first embodiment.
Figure 4:
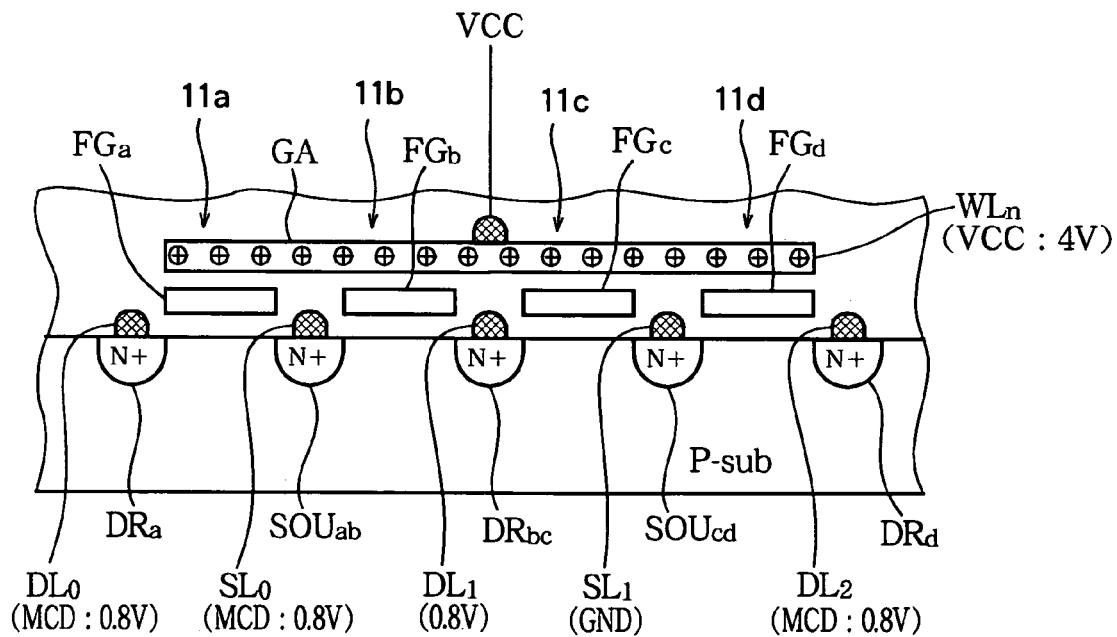
FIG. 4 is a diagram (No. 2) for describing a data write operation of the EPROM according to the first embodiment.
Figure 5:
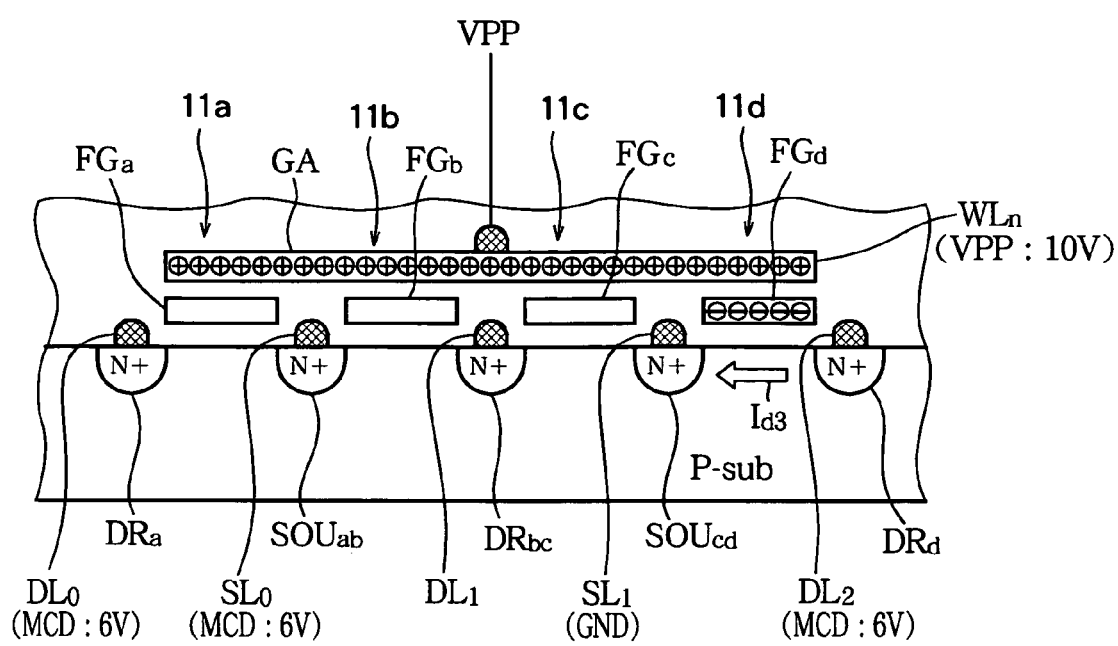
FIG. 5 is a diagram (No. 3) for describing a data write operation of the EPROM according to the first embodiment.
Figure 16:
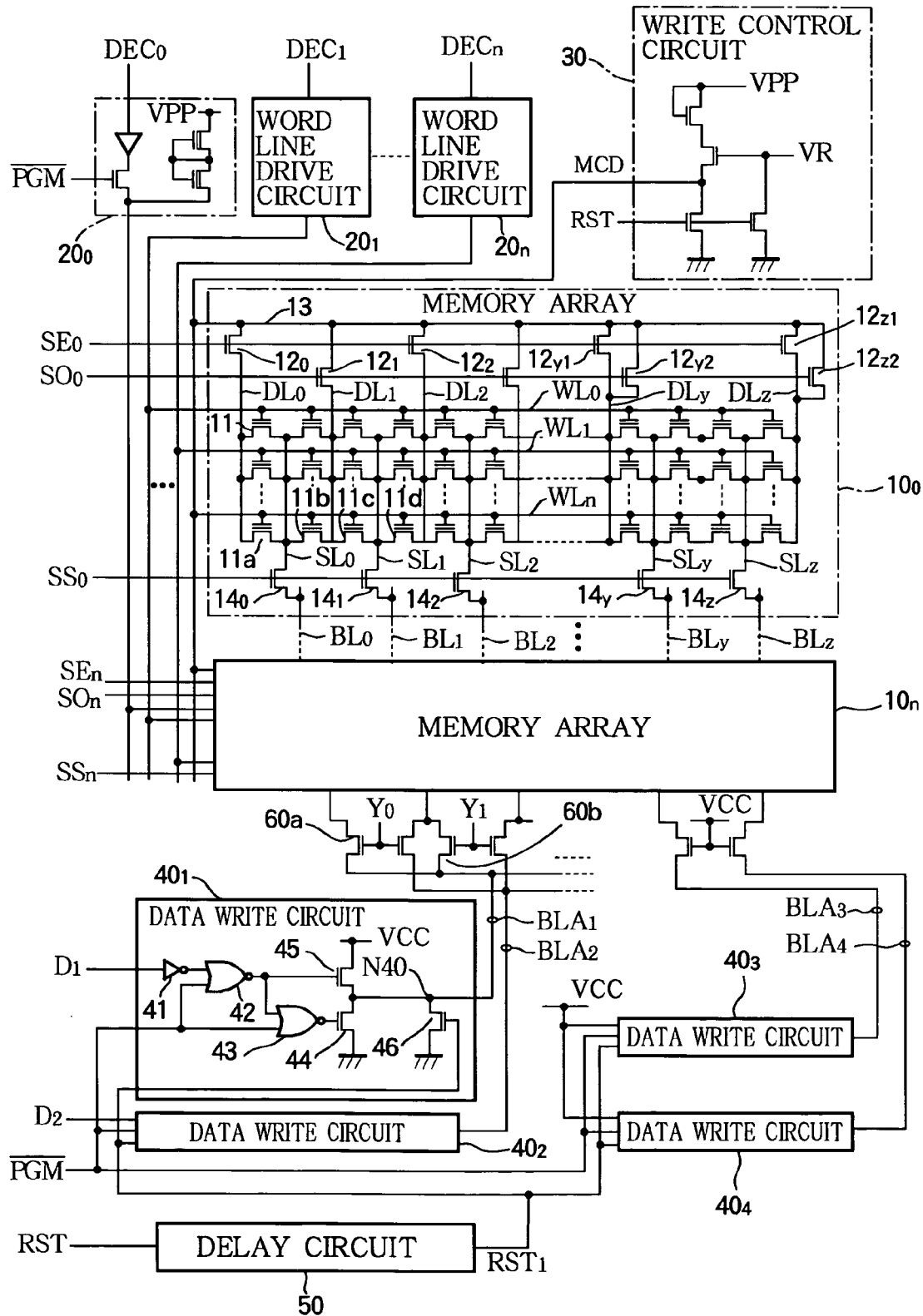
FIG. 16 is a diagram schematically showing the construction of a prior art EPROM.
Figure 17:
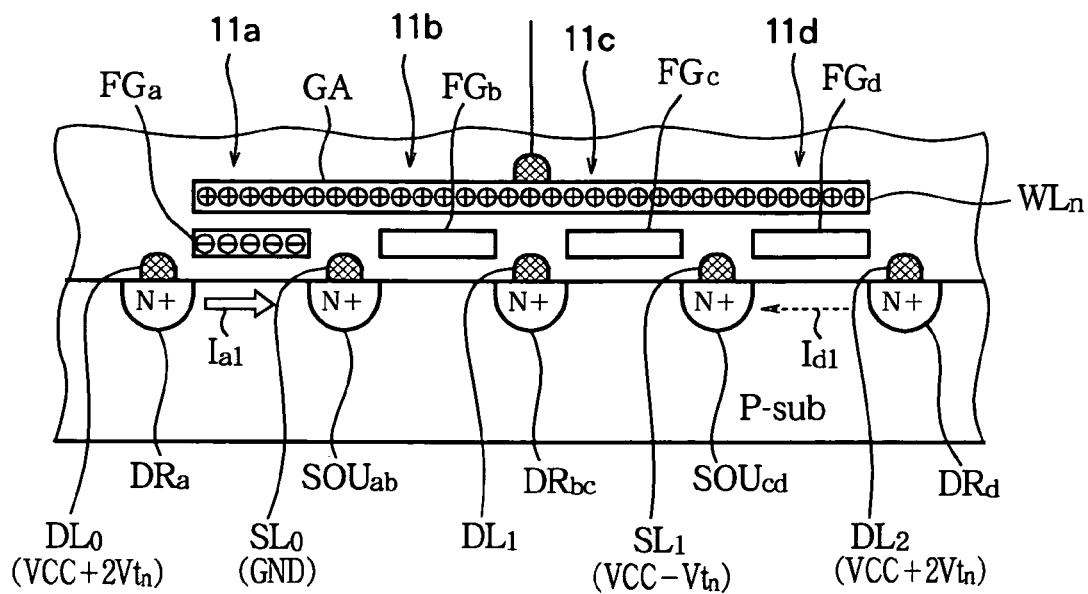
FIG. 17 is a diagram schematically showing the construction of memory cells of a conventional EPROM.
Figure 18:
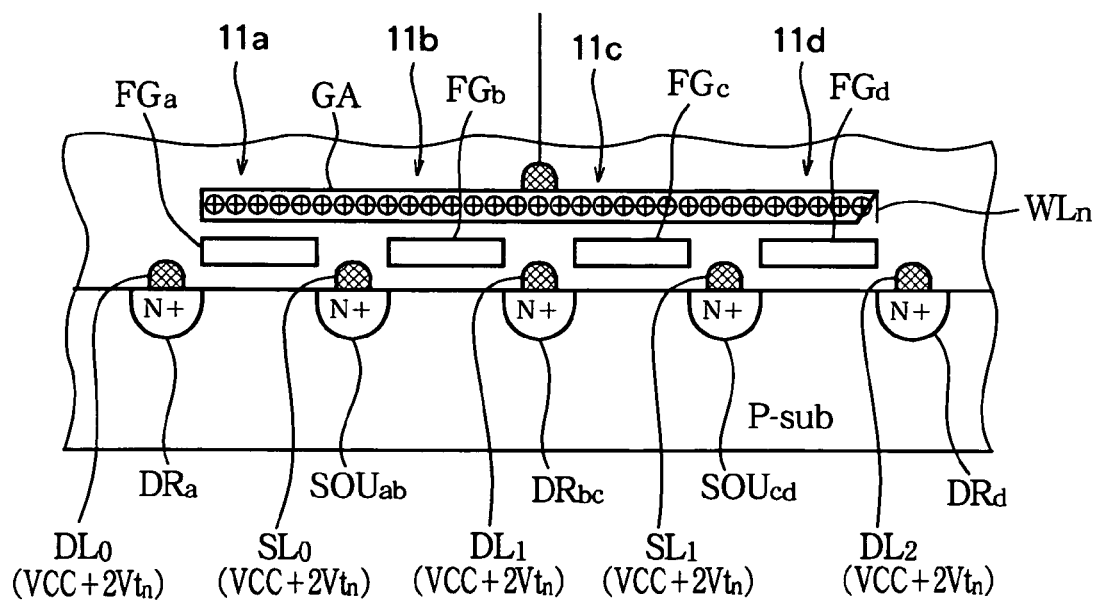
FIG. 18 is a diagram (No. 1) for describing a problem of the conventional EPROM.
Figure 19:
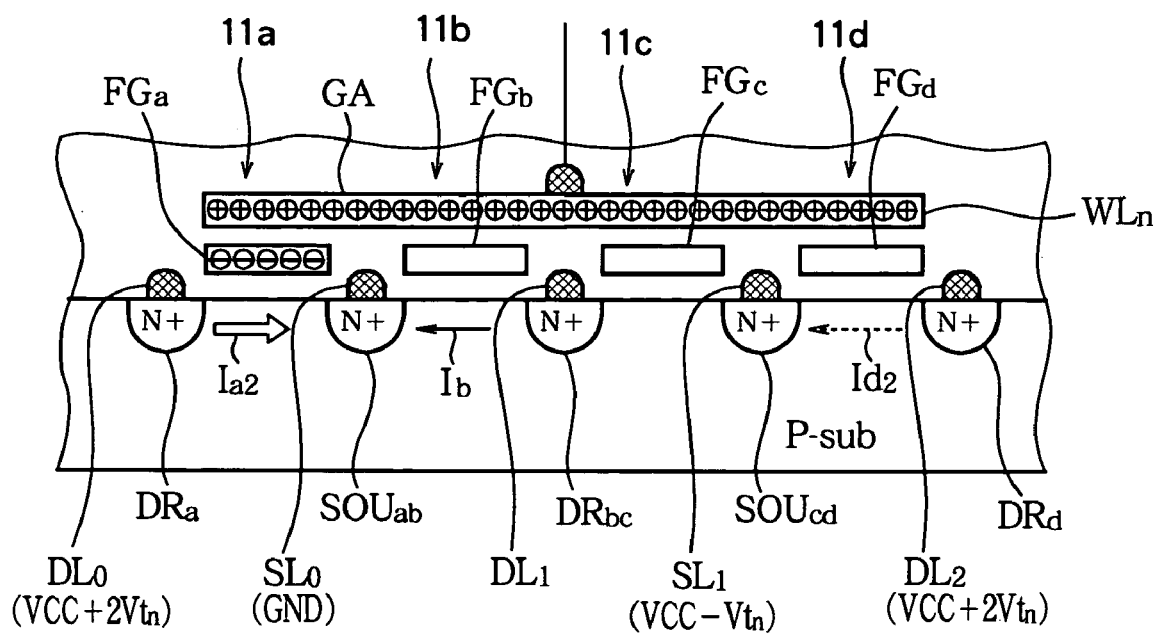
FIG. 19 is a diagram (No. 2) for describing a problem of the conventional EPROM.

FIG. 1 is a diagram schematically showing the construction of an EPROM which is a semiconductor memory device according to the first embodiment of the present invention. Those structures in FIG. 1 that are identical to or correspond to structures in FIG. 16 are assigned identical symbols. Further, FIG. 2 is a signal waveform diagram for describing a data write operation of the EPROM according to the first embodiment. Furthermore, FIGS. 3 to 5 are diagrams (Nos. 1–3) for describing a data write operation of the EPROM according to the first embodiment.

The EPROM according to the first embodiment includes memory arrays $10_0, \ldots, 10_n$ provided with plural memory cells 11 (in distinguishing and describing each, the symbols 11a, 11b, 11c and 11d will also be used) formed in a semiconductor substrate. The region on the semiconductor substrate in which the memory arrays $10_0, \ldots, 10_n$ are formed is provided with plural word lines $WL_0, \ldots, WL_n$, plural drain lines $DL_0, \ldots, DL_y, DL_z$, and plural source lines $SL_0, \ldots, SL_y, SL_z$.

Figure 3:
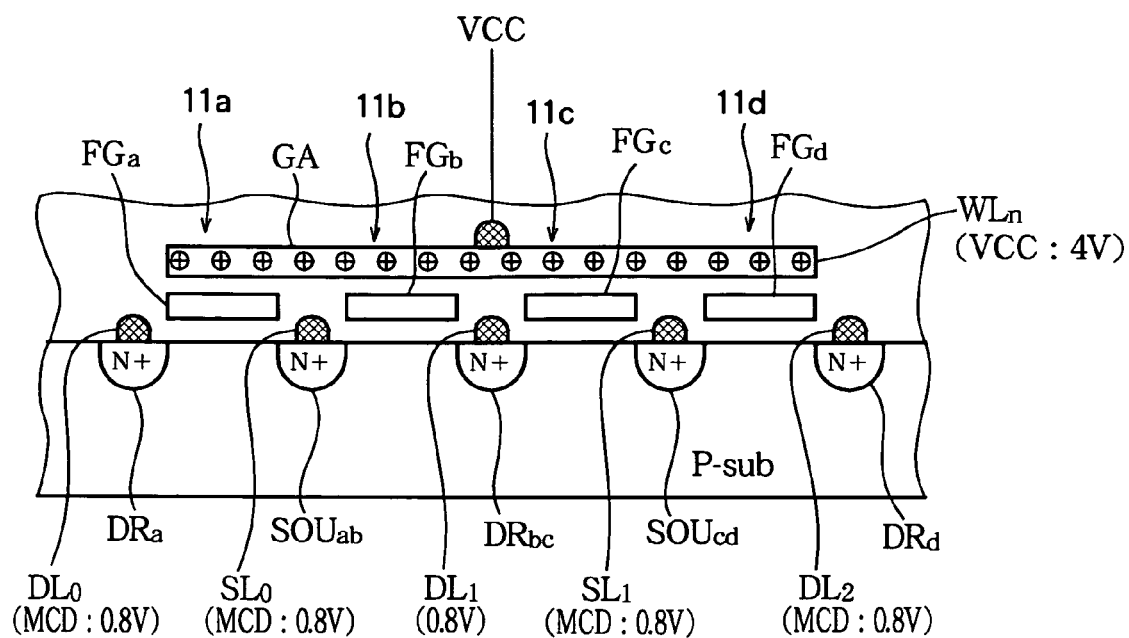
FIG. 3 is a diagram (No. 1) for describing a data write operation of the EPROM according to the first embodiment.

The memory cells 11 (11a, 11b, 11c and 11d) are field effect transistors which have gates (e.g., gates GA in FIG. 3), drains (e.g., drains $DR_a$, $DR_{bc}$ and $DR_d$ in FIG. 3), sources (e.g., sources $SOU_{ab}$ and $SOU_{cd}$ in FIG. 3), and floating gates (e.g., $FG_a$, $FG_b$, $FG_c$ and $FG_d$ in FIG. 3).

The gates of the plural memory cells 11 are connected to one of the plural word lines $WL_0, \ldots, WL_n$. Each drain of the plural memory cells 11 is connected to one of the plural drain lines $DL_0, \ldots, DL_y, DL_z$, and each source of the plural memory cells 11 is connected to one of the plural source lines $SL_0, \ldots, SL_z$. The EPROM also includes circuits such as an address decoder for generating the decoded signals $DEC_0, \ldots, DEC_n$, and a sense amplifier to read the data stored in the memory cells 11, these not being shown in the figures.

In each of the memory arrays $10_0, \ldots, 10_n$, the drain lines $DL_0, \ldots, DL_y, DL_z$ are respectively connected via the NMOS transistors $12_0, \ldots, 12_{y1}$ (or $12_{y2}$), $12_{z1}$ (or $12_{z2}$) to the write control line 13, to which a drain drive voltage MCD is supplied. In each of the memory arrays $10_0, \ldots, 10_n$, ON/OFF control of the even-numbered NMOS transistors $12_0, 12_2, \ldots, 12_{y1}, 12_{z1}$ is performed by the even number selection signals $SE_0, \ldots, SE_n$, respectively, and ON/OFF control of the odd-numbered NMOS transistors $12_1, 12_3, \ldots, 12_{y2}, 12_{z2}$ is performed by the odd number selection signals $SO_0, \ldots, SO_n$, respectively. Moreover, in each of the memory arrays $10_0, \ldots, 10_n$, the source lines $SL_0, \ldots, SL_y, SL_z$ are respectively connected to the bit lines $BL_0, \ldots, BL_y, BL_z$ via the NMOS transistors $14_0, \ldots, 14_y, 14_z$ which are ON/OFF controlled by the memory array selection signals $SS_0, \ldots, SS_n$.

The EPROM according to the first embodiment also includes the word line drive circuits $20_0, \ldots, 20_n$ which supply drive signals to each of the word lines $WL_0, \ldots, WL_n$, a write control circuit 30A which supplies the drain drive voltage MCD to the write control line 13, and data write circuits $40A_1$ and $40A_2$ which supply data $BLA_1$ and $BLA_2$ (data supplied to the bit lines $BL_y$ and $BL_z$ are represented as $BLA_3$ and $BLA_4$, respectively) to the bit lines $BL_0, \ldots, BL_y, BL_z$ (the data write circuits $40_3$ and $40_4$ supply data $BLA_3$ and $BLA_4$ to the bit lines $BL_y$ and $BL_z$, respectively).

The word line drive circuits $20_0, \ldots, 20_n$ have mutually identical constructions. The word line drive circuits $20_0, \ldots, 20_n$ respectively generate and output word line selection signals to the word lines $WL_0, \ldots, WL_n$ according to the decoded signals $DEC_0, \ldots, DEC_n$ supplied from the address decoder. When the decoded signals $DEC_0, \ldots, DEC_n$ are at L-level indicating "non-selection", the word line drive circuits $20_0, \ldots, 20_n$ output the ground voltage GND to the word lines $WL_0, \ldots, WL_n$. When the decoded signals $DEC_0, \ldots, DEC_n$ are at H-level indicating "selection", the word line drive circuits $20_0, \ldots, 20_n$ operate according to the program mode signal ~PGM. During data write, the word line drive circuits $20_0, \ldots, 20_n$ output a program voltage VPP (e.g., 10 V) to the word lines $WL_0, \ldots, WL_n$, and during data read, output the power supply voltage VCC (e.g., 4 V) to the word lines $WL_0, \ldots, WL_n$, respectively.

The write control circuit 30A includes a reference voltage generating part 31, and is controlled by an identical control signal CON to the control signal inputted to the word line drive circuits $20_0, \ldots, 20_n$. During data write, the control signal CON inputted to the write control circuit 30A is at L-level. When the control signal CON is at L-level, the write control circuit 30A outputs the drain drive voltage MCD (e.g., 6 V) of the voltage VCC+2Vtn (where Vtn is a threshold voltage of the NMOS transistor and is approximately 1 V), and when the control signal CON is at H-level, it outputs a drain drive voltage MCD of, for example, 0.8 V.

The data write circuits $40A_1$, $40A_2$, $40A_3$ and $40A_4$ have mutually identical constructions. When a data write operation is performed by setting the program mode signal ~PGM to L-level, the data write circuits $40A_1$, $40A_2$, $40A_3$ and $40A_4$ output the ground voltage GND or the write signals $BLA_1$ and $BLA_2$ (or $BLA_3$ and $BLA_4$) of the power supply voltage VCC from the node N40 depending on whether the input data $D_1$ and $D_2$ are L-level or H-level (the input data of the data write circuits $40A_3$ and $40A_4$ is VCC). The data write circuits $40_1$, $40_2$, $40_3$ and $40_4$ are configured in such a way that when a data read operation is performed by setting the program mode signal ~PGM to H-level, the node N40 of the data write circuits $40A_1$, $40A_2$, $40A_3$ and $40A_4$ is in a high impedance state.

For example, the data write circuit $40A_1$ includes an inverter 41 to which the input data $D_1$ is supplied, a NOR gate 42 which outputs the negative logical sum of the output signal of the inverter 41 and the program mode signal ~PGM, and a NOR gate 43 which outputs the negative logical sum of the output signal of the NOR gate 42 and the program mode signal ~PGM. The data write circuit 40, also includes an NMOS transistor 44 which is connected between the node N40 and ground voltage GND, and is controlled by the output signal of the NOR gate 43, and an NMOS transistor 45 which is connected between the power supply voltage VCC and the node N40, and is controlled by the output signal of the NOR gate 42.

The write signals $BLA_1$ and $BLA_2$ outputted from the data write circuits $40A_1$ and $40A_2$ are supplied, for example, to the adjacent bit lines $BL_0$ and $BL_1$ via the transistors $60a$ and $60b$ selected by the column selection signals $Y_0$ and $Y_1$.

When the logical value 'L' is written as data into the memory cell 11 selected by the word line $WL_i$, the even number selection signal $SE_j$ or the odd number selection signal $SO_j$, the memory array selection signal $SS_j$ and the column selection signal $Y_k$, the data $D_2$ inputted to the data write circuit $40A_2$ is at L-level. At this time, the gate voltage Vg of the memory cell 11 is 10 V, the drain voltage Vd is VCC+2Vtn (=6 V), and the source voltage Vs is 0 V. Therefore, in the memory cell 11, a large current $I_{d3}$ flows from the drain $DR_d$ to the source $SOU_{cd}$, and electrons are injected into the floating gate (e.g., in FIG. 5, the floating gate $FG_d$) by the avalanche hot carrier generated by this current.

On the other hand, when the logical value 'H' is written as data into the memory cell 11 selected by the word line $WL_i$, the even number selection signal $SE_j$ or the odd number selection signal $SO_j$, the memory array selection signal $SS_j$ and the column selection signal $Y_k$, the data $D_2$ inputted to the data write circuit $40A_2$ is at H-level. At this time, the gate voltage Vg of the memory cell 11 is 10 V, the drain voltage Vd is VCC+2Vtn (=6 V), and the source voltage Vs is VCC−Vtn (=3 V). Therefore, in the memory cell 11, only a relatively small current flows from the drain to the source (e.g., from the drain $DR_a$ to the source $SOU_{ab}$), and electrons are not injected into the floating gate (e.g., in FIG. 5, the floating gate $FG_a$) by an avalanche hot carrier.

In the EPROM according to the first embodiment, the two adjacent bit lines $BL_k$ and $BL_{k+1}$ are selected simultaneously by the column selection signal $Y_k$. The data (e.g., data $BLA_1$ and $BLA_2$) outputted from the data write circuits (e.g., the data write circuits $40A_1$ and $40A_2$) are written respectively into the two memory cells 11 connected to the selected bit lines $BL_k$ and $BL_{k+1}$. In FIG. 1, the memory cells $11a$ and $11d$ are selected by the word line $WL_0$, the even number selection signal $SE_0$, the memory array selection signal $SS_0$ and the column selection signal $Y_0$, and the data $BLA_1$ and $BLA_2$ are simultaneously written into the memory cells $11a$ and $11d$, respectively. For example, when the memory cell $10_0$ is selected by the memory array selection signal $SS_0$, the word line $WL_0$ is selected by the word line drive circuit $20_n$, the bit lines $BL_0$ and $BL_1$ are selected by the column selection signal $Y_0$, and the drain lines $DL_0$ and $DL_2$ are selected by the even number selection signal $SE_0$, a current flows from the drain line $DL_0$ via the memory cell $11a$, source line $SL_0$, NMOS transistor $14_0$, and bit line $BL_0$. As a result, a charge accumulates in the floating gate of the memory cell $11a$ (when it has the logical value 'L'), or does not accumulate in it (when it has the logical value 'H'). Also, a current flows from the drain line $DL_2$ via the memory cell $11d$, source line $SL_1$, NMOS transistor $14_1$, and bit line $BL_1$. As a result, a charge accumulates in the floating gate of the memory cell $11d$ (when it has the logical value 'L'), or does not accumulate in it (when it has the logical value 'H').

If the program mode signal ~PGM inputted to the data write circuits $40A_1$ and $40A_2$ is at H-level, the outputs of the NOR gates 42 and 43 are both at L-level, and the NMOS transistors 44 and 45 are both OFF. As a result, the outputs of the data write circuits $40A_1$ and $40A_2$ (i.e., the node N40) are in a high impedance state. At this time, a current path from the memory cells $11a$, $11b$, $11c$ and $11d$ to the ground voltage GND does not exist, so when the memory cells $11a$, $11b$, $11c$ and $11d$ are in the logical value 'H' state, the drain lines $DL_0$, $DL_1$ and $DL_2$, the source lines $SL_0$ and $SL_1$, and the bit lines $BL_0$ and $BL_1$ increase to the drain drive voltage MCD, i.e., VCC+2Vtn, via the memory cells $11a$, $11b$, $11c$ and $11d$.

Here, when the logical value 'H' is written into the memory cell $11a$ and the logical value 'L' is written into the memory cell $11d$, the program mode signal ~PGM inputted to the data write circuits $40_1$ and $40_2$ is at L-level, the write signal $BLA_1$ outputted from the data write circuit $40_1$ is at H-level, and the write signal $BLA_2$ outputted from the data write circuit $40_2$ is at L-level. The voltage of the bit line $BL_0$ is then a value of (VCC−Vtn), and the voltage of the bit line $BL_1$ is GND. At this time, as shown by the arrow $I_{d3}$ in FIG. 5, current flows from the drain $DR_d$ to the source $SOU_{cd}$ at the voltage GND, electrons are injected into the floating gate $FG_d$ by the avalanche hot carrier and the logical value 'L' is written into the memory cell $11d$. Also, only a small current flows from the drain $DR_a$ to the source $SOU_{ab}$ at a voltage (VCC−Vtn) electrons are not injected into the floating gate $FG_a$ by the avalanche hot carrier, and therefore, the logical value 'H' is written into the memory cell $11a$.

Next, a data write operation of the EPROM according to the first embodiment will be described with reference to FIGS. 2 to 5.

First, at a time to in FIG. 2, the program mode signal ~PGM and the control signal CON are set to H-level. At the time $t_0$, the address signal ADR which specifies the address to be written is supplied to the address decoder (not shown). The address decoder which received the address signal ADR selects the memory array selection signal (i.e., one of the memory array selection signals $SS_0, \ldots, SS_n$) for selecting the memory array (i.e., one of the memory arrays $10_0, \ldots, 10_n$) containing the address to be written (i.e., selects H-level). The address decoder which received the address signal ADR supplies the decode signal (e.g., the decode signal $DEC_n$) for selecting one word line, e.g., the word line $WL_0$ in the selected memory array, e.g., memory array $10_0$, (namely, for causing one word line to be at H-level) to the word line drive circuit, e.g., the word line drive circuit $20_n$.

When the memory array selection signal $SS_0$ is selected, (i.e., set to H-level), the NMOS transistors $14_0, \ldots, 14_z$ of the selected memory array $10_0$ are set to ON, and the source lines $SL_0, \ldots, SL_z$ of the selected memory array $10_0$ are connected to the bit lines $BL_0, BL_z$ via the NMOS transistors $14_0, \ldots, 14_z$, respectively. On the other hand, the memory arrays $10_1, \ldots, 10_n$ which are not selected are electrically isolated from the bit lines $BL_0, \ldots, BL_z$.

Also, the word line drive circuit $20_n$ supplies the power supply voltage VCC (e.g., 4 V) to the selected word line $WL_0$ as a word line selection signal (word line drive voltage), and the power supply voltage VCC is thereby commonly applied to the control gates of the memory cells 11 connected to the word line $WL_0$. The voltage of the word lines $WL_0, \ldots, WL_{n-1}$ which are not selected, is ground voltage GND.

The write control circuit 30A also applies a drive voltage of, for example, 0.8 V to the drain of the selected memory cell 11 as the drain drive voltage (MCD).

At the time $t_0$, the program mode signal ~PGM is at H-level. The voltages $BLA_1$, $BLA_2$, $BLA_3$ and $BLA_4$ of the output node N40 from the data write circuits $40A_1$, $40A_2$, $40A_3$ and $40A_4$ are in the high impedance (H.I.) state, and the bit lines (e.g., the bit lines $BL_0$ and $BL_1$) and source lines (e.g., the bit lines $SL_0$ and $SL_1$) which are connected to the node N40 are also in the high impedance (H.I.) state.

At a time $t_1$, the program mode signal ~PGM is changed from H-level to L-level. At this time, the control signal CON is still H-level. If the program mode signal ~PGM is L-level, the output node of the data write circuits $40A_1$ and $40A_2$ will no longer be in a high impedance state, and will output the ground voltage GND or the drain drive voltage MCD (=0.8 V) corresponding to the input data $D_1$ and $D_2$ showing one of the logical values 'H' or 'L'. However, at this time, since the data write circuits $40A_1$ and $40A_2$ are not connected to the data bus, the input data $D_1$ and $D_2$ are pulled up to H-level, and the write signals $BLA_1$ and $BLA_2$ become the same (0.8 V) as the drain drive voltage MCD (see FIG. 3). Therefore, not only in the memory cells $11a$ and $11d$ into which data are to be written but also in the adjacent memory cells $11b$ and $11c$, the voltages of drain and source approximate the ground voltage GND.

At a time $t_2$, the input data $D_1$ (e.g., H-level) and $D_2$ (e.g., L-level) to be written are supplied to the data write circuits $40A_1$ and $40A_2$, respectively, via an input/output buffer (not shown). The write data signal $BLA_1$ of the data write circuit $40A_1$ to which the input data $D_1$ at H-level was supplied, is still at the drain drive voltage MCD. The write data signal $BLA_2$ of the data write circuit $40A_2$ to which the input data $D_2$ at L-level was supplied, is at the ground voltage GND (see FIG. 4).

At a time $t_3$, the control signal CON is set to L-level. At this time, the NMOS transistor 21 in the word line drive circuit $20n$ is OFF, and the word line selection signal outputted to the word line $WL_0$ from of word line drive circuit $20_n$ changes from the voltage VCC (=4 V) to the program voltage VPP (=10 V). Also, the drain drive voltage MCD outputted from the write control circuit 30A increases from 0.8 V to the voltage VCC+2Vtn (=6 V) due to the reference voltage generating part 31, and is supplied to the drains of the memory cells $11a$ and $11d$ in which the drain drive voltage MCD was selected and the data write circuits $40A_1$ and $40A_2$ (see FIG. 5). Therefore, the write voltages $BLA_1$ and $BLA_2$ respectively outputted to the bit lines $BL_0$ and $BL_1$ from the data write circuits $40A_1$ and $40A_2$ are respectively the drain drive voltage MCD (i.e., VCC+2Vtn) and ground voltage GND corresponding to the input data $D_1$ and $D_2$.

Due to this, in the memory cell $11d$ selected by the address signal ADR in which it was specified to write the input data $D_2$ at L-level, the program voltage VPP (=10 V) is applied to the control gate, the drain drive voltage MCD (=6 V) is applied to the drain, and the ground voltage GND (=0 V) is applied to the source, respectively. In this memory cell $11d$, the voltage between the control gate and source is a high voltage (10 V), and the voltage between the source and drain is a high voltage (6 V), so some of the electrons (current $I_{d3}$ of FIG. 5) flowing between the drain and the source are accelerated by the electric field and gain energy, exceed the energy barrier of the gate insulation film, and are injected into the floating gate.

On the other hand, in the memory cell 11a selected by the address signal ADR in which it was specified to write the input data $D_1$ at H-level, the program voltage VPP (=10 V) is applied to the control gate, the drain drive voltage (MCD) (=6 V) is applied to the drain, and the voltage VCC−Vtn (=3 V) is applied to the source, respectively. In this case, the voltage between the control gate and source is 7 V, and the voltage between the drain and the source is 3 V, so the energy of the electrons flowing between the drain and the source is small, and these electrons are not injected into the floating gate.

Moreover, at the time $t_2$ (FIG. 4), the voltage of the drain line $DL_1$ is 0.8 V, and since the charge is very small, at the time $t_3$-$t_4$ (FIG. 5), a large current does not flow from the drain line $DL_1$, and there are no incorrect writes to memory cells (e.g., 11b) which are not selected.

At a time $t_4$, after the time required for data write has elapsed, the program mode signal ˜PGM changes from L-level to H-level, and the control signal CON changes from L-level to H-level. Also, the address signal ADR is changed over to another address. If the control signal CON is at H-level, the output voltage of the write control circuit 30A will be 0.8 V. Due to this, the charge accumulated on the write control line 13 starts to discharge, and the drain drive voltage MCD falls according to a fixed time constant. If the drain drive voltage MCD falls, therefore, the output voltages of the data write circuits $40A_1$ and $40A_2$ will also fall, and the voltage of the bit line BL will also fall.

As described above, in the EPROM according to the first embodiment, by controlling the selection signals $WL_0, \ldots, WL_n$ of the word lines outputted from the word line drive circuits $20_0, \ldots, 20_n$ and the change-over timing of the drain drive voltage MCD outputted from the write control circuit 30A by the program mode signal ˜PGM and the control signal CON which are supplied from outside, the voltage between the source and drain of the adjacent memory cells 11b and 11c is made to approach the ground voltage GND before data is written into the memory cells 11a and 11d which were selected for data write. Hence, a high voltage is no longer applied between the drain and source of the memory cells 11b and 11c which were not selected for data write when data write is performed, and consequently, there is no incorrect write of data due to flow of discharge current, and the problem of increase of the threshold voltage Vt of the memory cell causing access delay or fluctuations in the operating power supply voltage, can be avoided.

Second Embodiment

Figure 6:
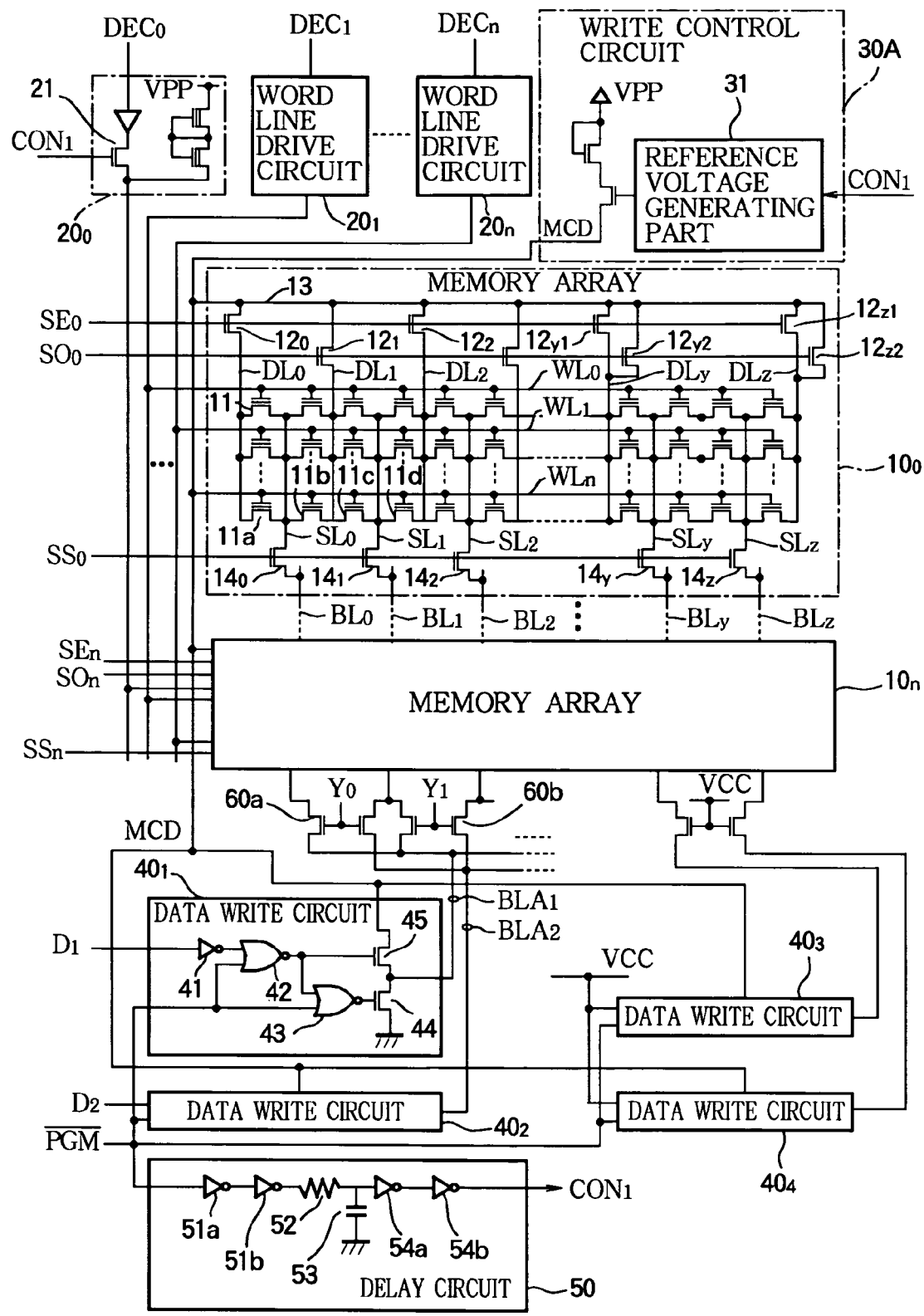
FIG. 6 is a diagram schematically showing the construction of the EPROM according to a second embodiment of the present invention.

FIG. 6 is a diagram schematically showing the construction of an EPROM which is a semiconductor memory device according to a second embodiment of the present invention. Those structures in FIG. 6 that are identical to or correspond to structures in FIG. 1 or FIG. 16 are assigned identical symbols. Further, FIG. 7 is a signal waveform diagram for describing a data write operation of the EPROM according to the second embodiment.

The EPROM according to the second embodiment differs from the EPROM of the first embodiment in that the delay circuit 50 is provided, the program mode signal ˜PGM is delayed by the delay circuit 50, and this delayed signal is supplied to the word line drive circuits $20_0, \ldots, 20_n$ and write control circuit 30A as a control signal $CON_1$. The delay circuit 50 includes components such as a resistance, a capacitor and buffers, and the retardation amount is set to a time interval corresponding to the time $t_1$ to the time $t_3$ in FIG. 2. As shown in FIG. 6, the delay circuit 50, for example, includes inverters 51a and 51b, a resistance 52, a capacitor 53, and inverters 54a and 54b. The construction of the delay circuit 50 is not limited to that shown in this figure.

Figure 7:
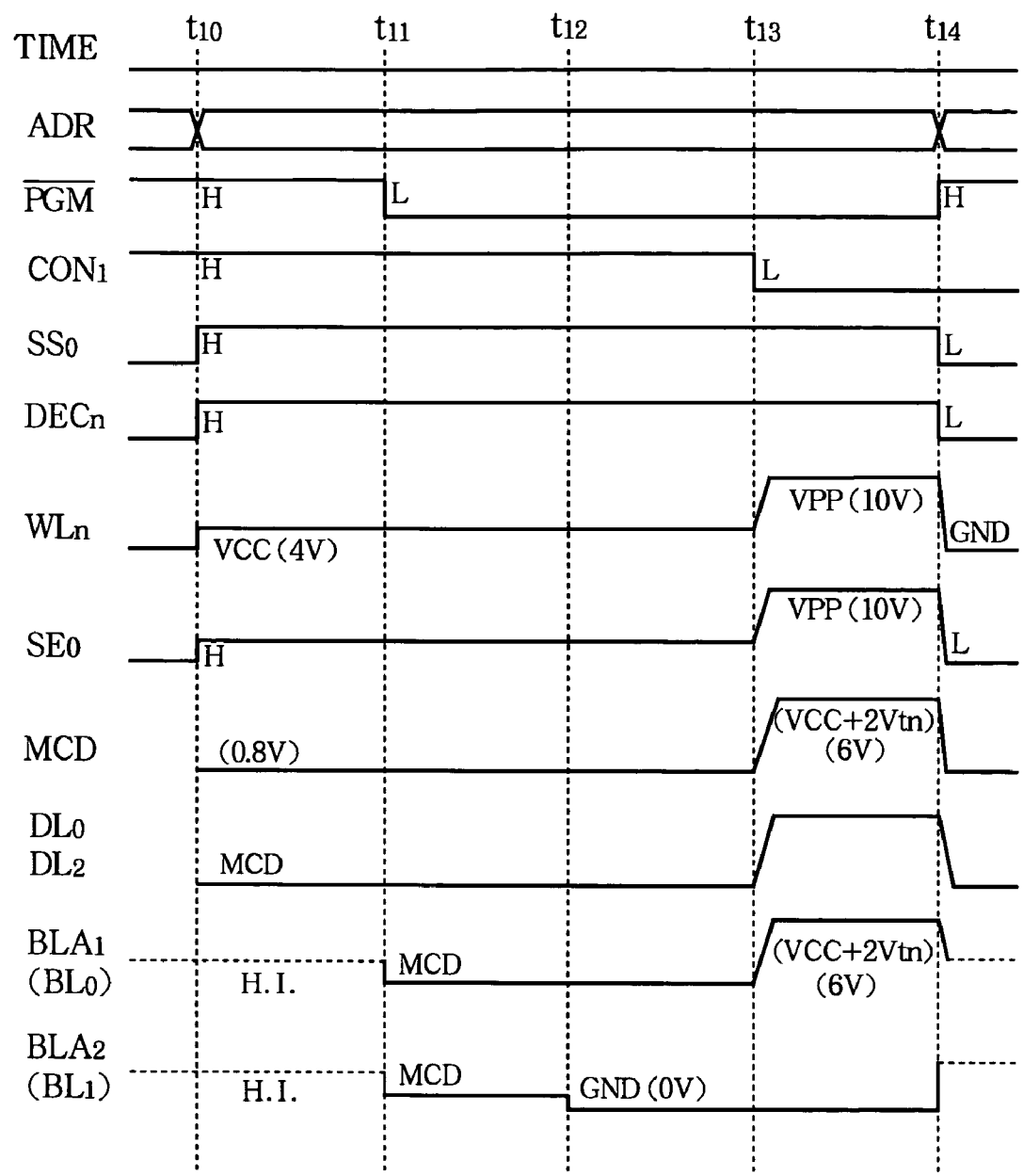
FIG. 7 is a signal waveform diagram for describing a data write operation of the EPROM according to the second embodiment.

As shown in FIG. 7, the signal waveform when a data write is performed in the EPROM according to the second embodiment is substantially identical to according to the first embodiment if the control signal CON is replaced by the control signal $CON_1$. However, the control signal $CON_1$ is not at H-level at the time $t_{14}$, but becomes H-level after a predetermined delay time.

By adding a logic circuit such that the control signal $CON_1$ becomes L-level at a given time after the program mode signal ˜PGM becomes L-level, and always outputting the H-level control signal $CON_1$ when the program mode signal (˜PGM) is at H-level, a control signal having an identical timing to the control signal $CON_1$ of FIG. 7 can be generated.

As described above, the EPROM according to the second embodiment includes the delay circuit 50 which delays the program mode signal PGM to generate the control signal $CON_1$, so the same advantage as that of the EPROM of the first embodiment can be obtained without requiring the external control signal CON. Except for the above point, the second embodiment is identical to the case of the aforesaid first embodiment.

Third Embodiment

Figure 8:
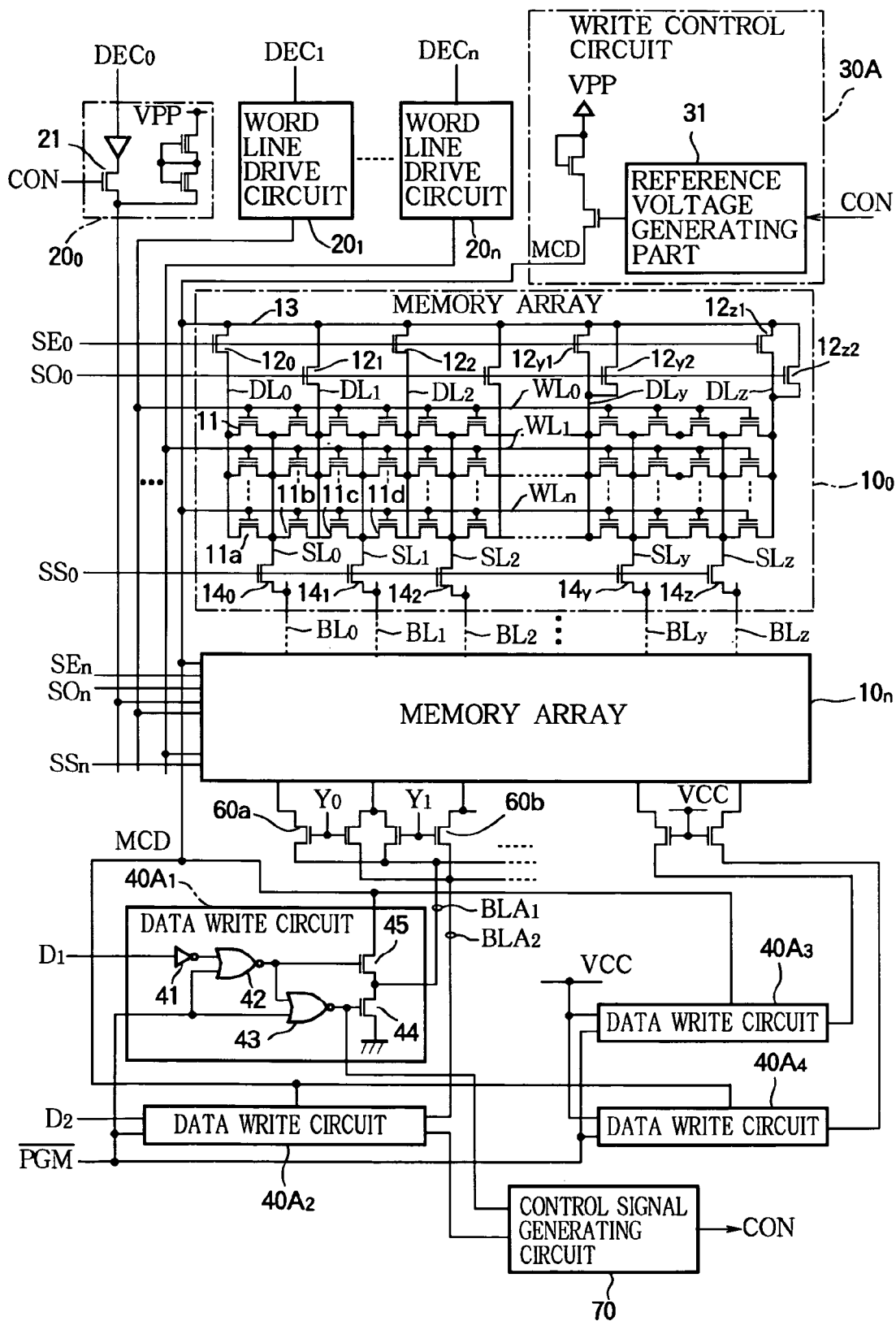
FIG. 8 is a diagram schematically showing the construction of an EPROM according to a third embodiment of the present invention.

FIG. 8 schematically shows the construction of an EPROM which is a semiconductor memory device according to a third embodiment of the present invention. Those structures in FIG. 8 that are identical to or correspond to structures in FIG. 1, FIG. 6 or FIG. 16 are assigned identical symbols. Further, FIG. 9 is a circuit diagram showing the construction of a control signal generating circuit 70 of the EPROM according to the third embodiment.

The EPROM according to the third embodiment differs from the EPROM of the first embodiment in that the control signal generating circuit 70 is provided, the control signal CON is generated by this control signal generating circuit 70, and supplied to the word line drive circuits $20_0, \ldots, 20_n$ and write control circuit 30A. The control signal generating circuit 70 generates the control signal CON to be supplied to the word line drive circuits $20_0, \ldots, 20_n$ and write control circuit 30A using the signals in the data write circuits $40A_1$ and $40A_2$.

Figure 9:
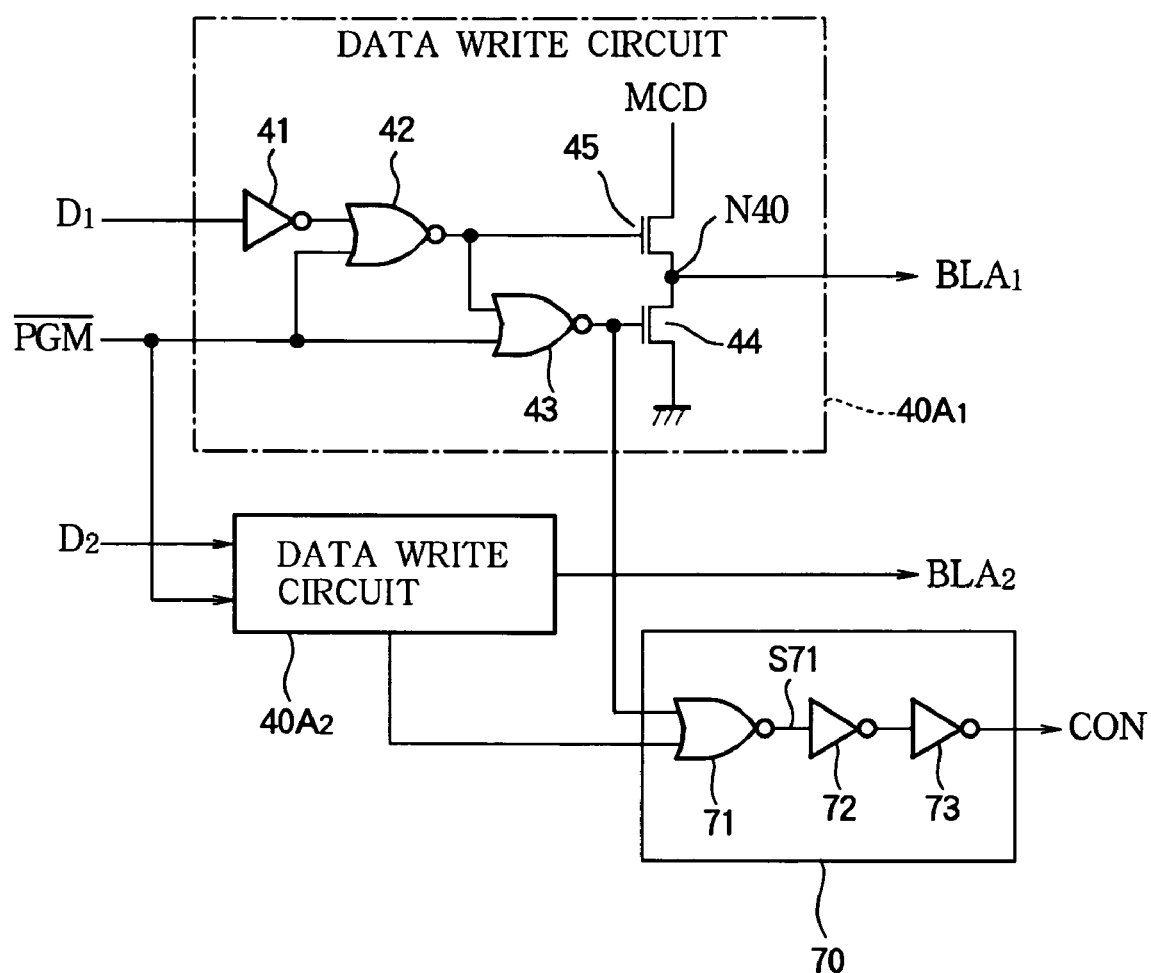
FIG. 9 is a circuit diagram showing the construction of a control signal generation circuit of the EPROM according to the third embodiment.

As shown in FIG. 9, the control signal generating circuit 70 includes a NOR gate 71 which negates the logical sum of a signal S43 outputted from a NOR gate 43 in the data write circuits $40A_1$ and $40A_2$, and inverters 72 and 73 connected to the output node of the NOR gate 71 (these form a delay circuit). The control signal CON is outputted from this delay circuit.

In the EPROM according to the third embodiment, until the valid input data $D_1$ and $D_2$ is supplied, i.e. during the time $t_0$–$t_2$ in FIG. 2, the signal S43 outputted from the data write circuits is at L-level. Therefore, a signal S71 outputted from the NOR gate 71 and the control signal CON are at H-level.

At the time $t_2$, when the valid data $D_1$ and $D_2$ are supplied, and at least one of the input data $D_1$ and $D_2$ is at L-level, the signal S71 outputted from the NOR gate 71 is at L-level. The signal S71 is delayed by the inverters 72 and 73, and at the time $t_3$, the control signal CON becomes L-level and is outputted. Except for the above point, the EPROM according to the third embodiment is identical to the case of the aforesaid second embodiment.

When the valid input data $D_1$ and $D_2$ are both at H-level, the control signal CON remains H-level and does not become L-level. Therefore, in this case, a write operation (i.e., a write of logical value data 'L' due to charge injection into the floating gate) does not occur in the memory cell. However, the fact that a charge is not injected into the memory cell means that logical value data 'H' is written.

As described above, in the EPROM according to the third embodiment, if at least one of the input data $D_{1\ and\ D2}$ is at L-level, the control signal CON is outputted with a predetermined time delay after data input. Hence, if all the input data is at H-level, a data write operation is not performed. Therefore, in the EPROM according to the third embodiment, in addition to having an identical advantage to that of the second embodiment, an unnecessary write voltage is not applied, and the stress on the memory cell is mitigated.

Fourth Embodiment

Figure 10:
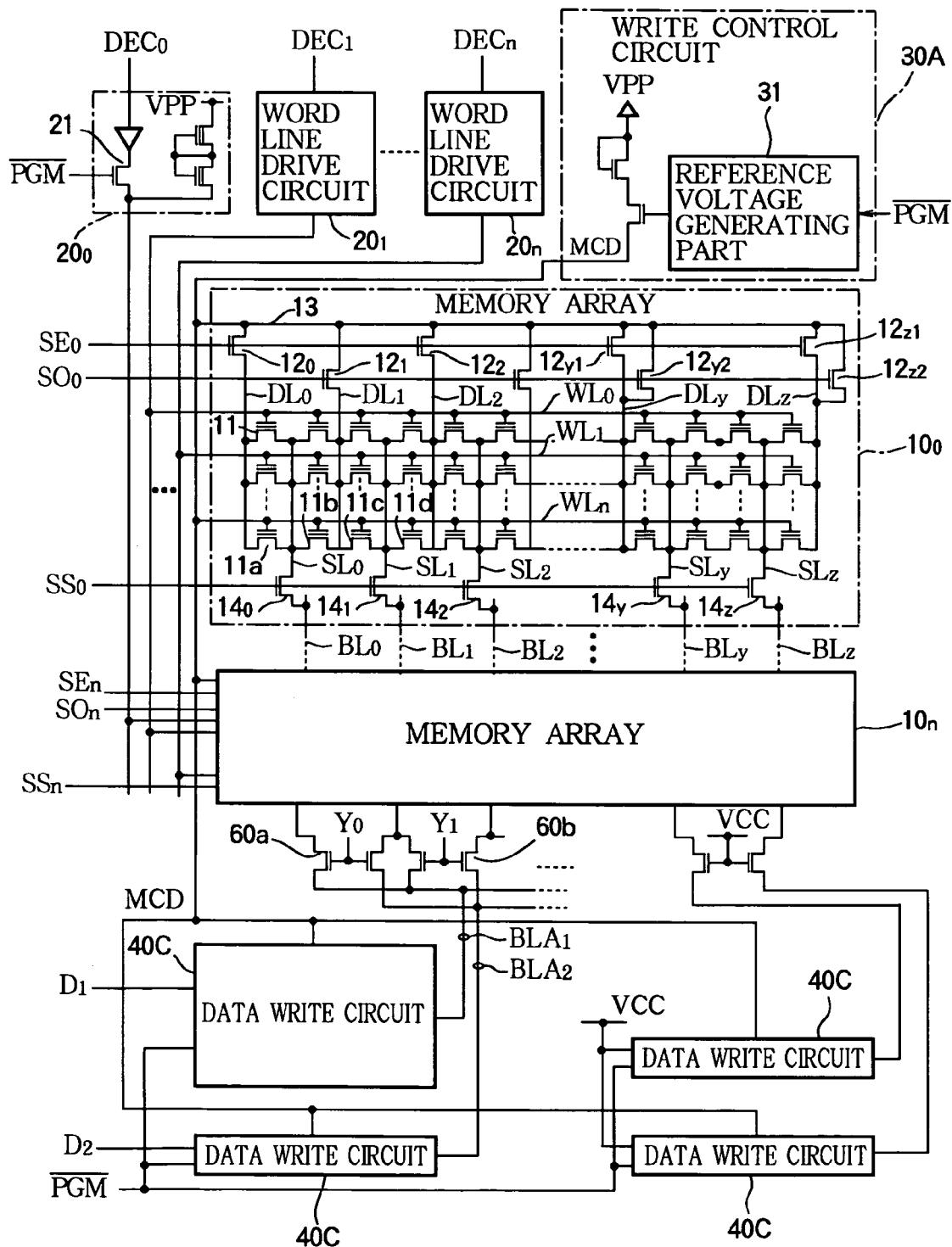
FIG. 10 is a diagram schematically showing the construction of an EPROM according to a fourth embodiment of the present invention.
Figure 11:
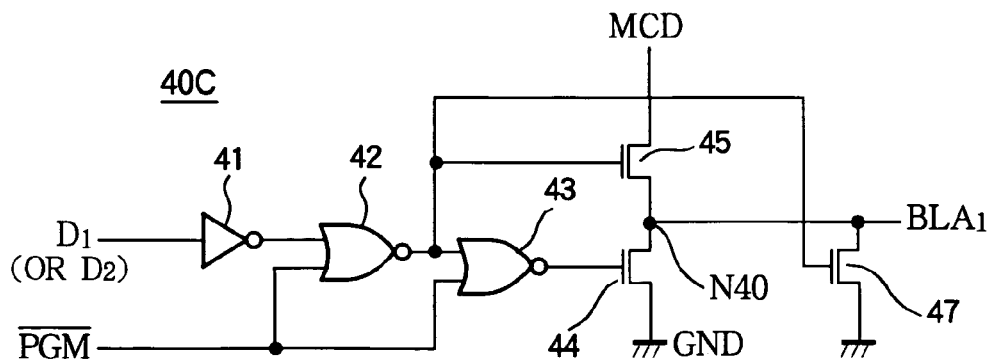
FIG. 11 is a circuit diagram showing the construction of the data write circuit of the EPROM according to the fourth embodiment.

FIG. 10 is a diagram schematically showing the construction of an EPROM which is a semiconductor memory according to a fourth embodiment of the present invention. Those structures in FIG. 10 that are identical to or correspond to structures in FIG. 1, FIG. 6, FIG. 8 or FIG. 16 are assigned identical symbols. Further, FIG. 11 is a circuit diagram showing the construction of a data write circuit 40C of the EPROM according to the fourth embodiment.

In the EPROM according to the fourth embodiment, the construction of the data write circuit 40C differs from the EPROM of the first embodiment. In the data write circuit 40C of the fourth embodiment, an NMOS transistor 47 of which the transconductance $g_m$ is much smaller than that of the NMOS transistor 45, is connected between the node N40 of the data write circuit $40A_1$ shown in FIG. 1 and the ground voltage GND, and the output signal of the NOR gate 42 is supplied to the gate of the NMOS transistor 47.

In the EPROM which uses this data write circuit 40C, instead of the control signal CON supplied to the word line drive circuits $20_0$, ..., $20_n$, and write control circuit 30A, the program mode signal ~PGM is used.

Figure 12:
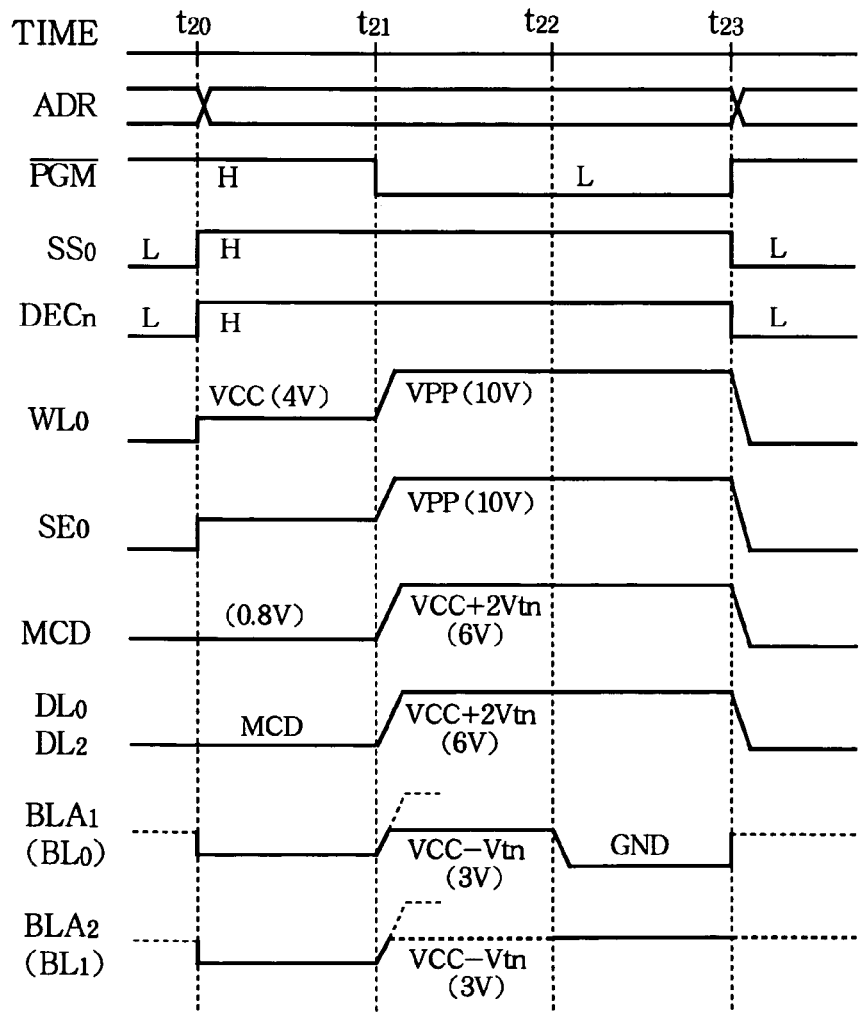
FIG. 12 is a signal waveform diagram for describing a data write operation of the EPROM according to the fourth embodiment.
Figure 13:
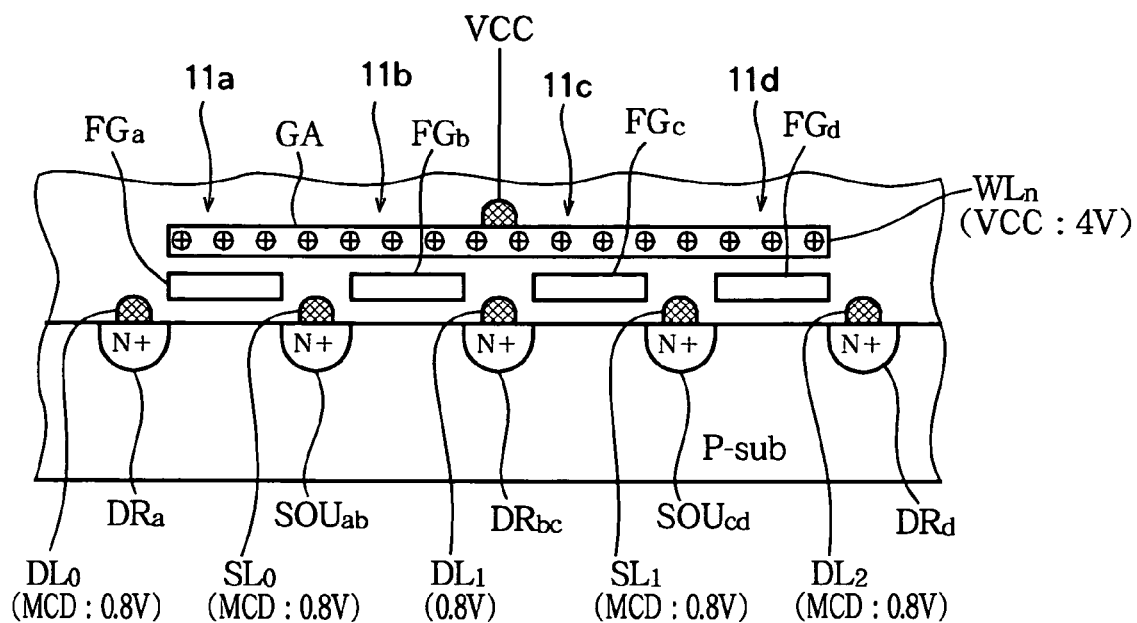
FIG. 13 is a diagram (No. 1) for describing a data write operation of the EPROM according to the fourth embodiment.
Figure 14:
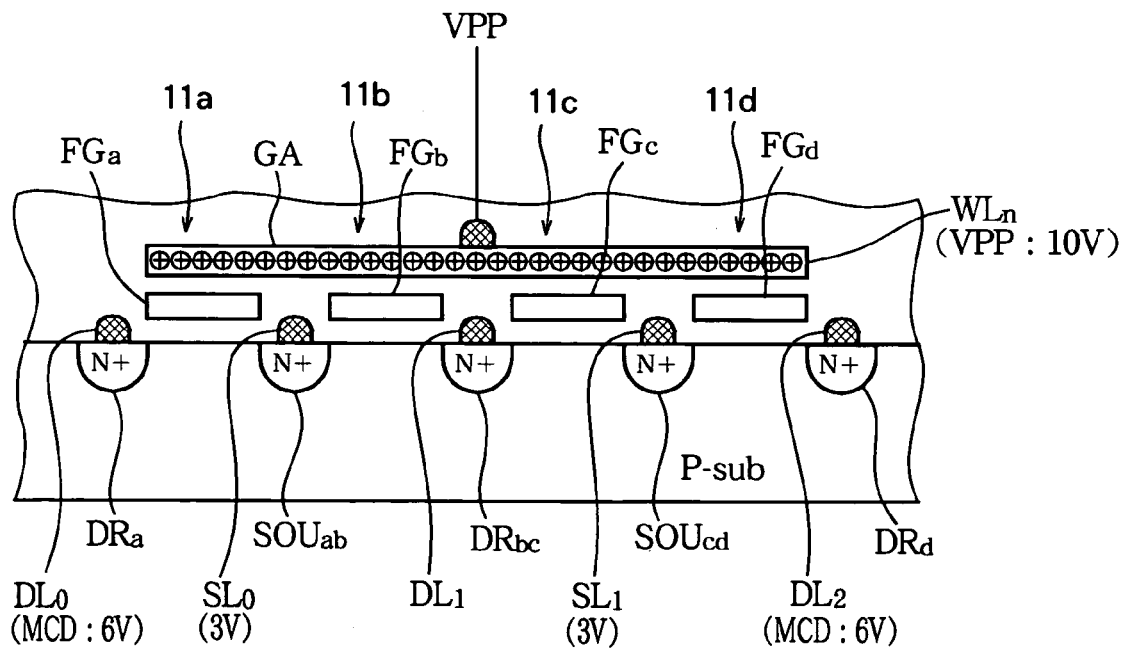
FIG. 14 is a diagram (No. 2) for describing a data write operation of the EPROM according to the fourth embodiment.
Figure 15:
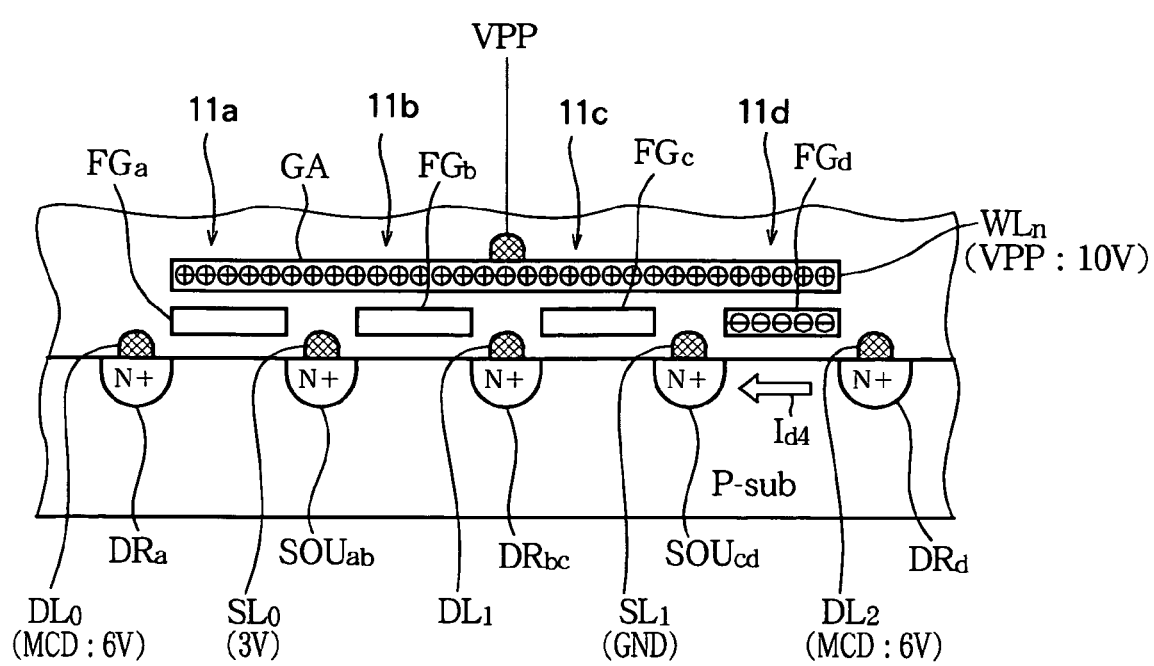
FIG. 15 is a diagram (No. 3) for describing a data write operation of the EPROM according to the fourth embodiment.

FIG. 12 is a signal waveform diagram for describing a data write operation of the EPROM according to the fourth embodiment. Further, FIG. 13 to FIG. 15 are diagrams (No. 1–No. 3) for describing a data write operation of the EPROM according to the fourth embodiment.

When a data write operation is not performed, the program mode signal PGM is set to H-level.

When data write starts, at a time $t_{20}$ in FIG. 12, the address signal ADR which specifies an address to be written is supplied to the address decoder, and from this address decoder, for example, the memory array selection signal $SS_0$ and even number selection signal $SE_0$ are supplied to the memory array $10_0$, and the decode signal $DEC_0$ which selects the word line $WL_0$ is supplied to the word line drive circuit $20_0$. As a result, the selected memory array $10_0$ is connected to the bit lines $BL_0$, ..., $BL_y$, $BL_z$, and the memory arrays $10_1$, ..., $10_n$ which were not selected are electrically isolated from these bit lines $BL_0$, ..., $BL_y$, $BL_z$. The selection signal of the power supply voltage VCC is also applied from the word line drive circuit $20_0$ to the control gate of the memory cell connected to the selected word line $WL_0$. Further, the drain drive voltage MCD is applied to the drain of the selected memory cell 11, and the source is connected to the data write circuit 40C via the source lines $SL_0$, ..., $SL_x$, $SL_z$ and bit lines $BL_0$, ..., $BL_y$, $BL_z$ (see FIG. 13).

At a time $t_{21}$, the program mode signal ~PGM is at L-level, and a data write operation starts. The output node of the data write circuit 40C is no longer in a high impedance state, and becomes ground voltage GND or the drain drive voltage MCD (at this time, 0.8 V) with respect to the input data $D_1$ and $D_2$. However, at this time the data write circuit 40C is not connected to the data bus, so the input data $D_1$ and $D_2$ are at H-level.

On the other hand, the word line selection signal outputted from the word line drive circuit $20_0$ to the word line $WL_0$ increases to the program voltage VPP (=10 V) Also, the drain drive voltage MCD outputted from the write control circuit 30A increases from 0.8 V to the voltage VCC+2Vtn (=6 V), and this drain drive voltage MCD is supplied to the drains $DR_a$ and $DR_d$ of the selected memory cells 11a and 11d and the data write circuit 40C.

At this time, in the data write circuit 40C, the NMOS transistor 47 is ON, so the voltage of the node N40 is set to the voltage VCC−Vtn (=3 V) by the transconductance $g_m$ ratio between this NMOS transistor 47 and the NMOS transistor 45. Therefore, the write voltages $BLA_1$ and $BLA_2$ outputted from the data write circuit 40C to the bit lines $BL_0$ and $BL_1$ increase only to the voltage VCC−Vtn (see FIG. 14).

At a time $t_{22}$, the input data $D_1$ (e.g., L-level) and $D_2$ (e.g., H-level) which are to be written are respectively supplied to the data write circuit 40C from the data bus via an input/output buffer (not shown). Due to this, the write data signal $BLA_1$ of the data write circuit 40C to which the L-level input data $D_1$ was supplied effectively becomes the ground voltage GND. On the other hand, the write data signal $BLA_2$ of the data write circuit 40C to which the H-level input data $D_2$ was supplied, remains the voltage VCC−Vtn. In this state, a charge is injected into the floating gate $FG_d$ by a current $I_{d4}$ and the logical value 'L' is written into the memory cell 11d, whereas the logical value 'H' is written into the memory cell 11a without injecting a charge into the floating gate $FG_a$ (see FIG. 15).

At a time $t_{23}$, after a time required for data write has elapsed, the program mode signal ~PGM becomes H-level, the address signal ADR changes over to another address, and the data write operation is terminated.

As described above, in the EPROM according to the fourth embodiment, the NMOS transistor 47 is added between the node N40 and ground voltage GND, and the write data signal $BLA_1$ does not increase above the voltage VCC−Vtn. Therefore, before writing data to the memory cells 11a and 11d to which data is to be written, the voltage of the drain and source of the adjacent memory cells 11b and 11c can be made equal to or less than the power supply voltage VCC. In this way, a high voltage is not applied between the drain and the source of the memory cells 11b and 11c to which data is not to be written during a data write, and an identical effect to that of the second embodiment is obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A semiconductor memory device comprising:
plural word lines;
plural drain lines;
plural source lines;
a memory array including plural memory cells formed from a field effect transistor having a gate, a drain, a source and a floating gate, said gate of each of said plural memory cells being connected to any of said plural word lines, said drain of each of said plural memory cells being connected to any of said plural drain lines, said source of each of said plural memory cells being connected to any of said plural source lines;
a data write circuit which receives a first control signal and write data and supplies a source drive voltage to said source line when data is written into said memory cell;
a write control circuit which receives a second control signal supplied later than said first control signal and supplies a drain drive voltage based on said second control signal to said drain line when data is written into said memory cell; and
a word line drive circuit which receives an address signal and said second control signal, and supplies a word line drive voltage based on said second control signal to said word line selected according to said address signal; wherein
said write control circuit outputs said drain drive voltage at a high level for data write via said drain line to said memory cell selected by said word line drive circuit when a data write operation is commanded by said second control signal, and outputs said drain drive voltage at a low level when a data write operation is not commanded by said control signal, and
said data write circuit generates a write voltage corresponding to a logical value of data to be written into said selected memory cell based on said drain drive voltage outputted from said write control circuit, and supplies said write voltage as said source drive voltage via said source line to said selected memory cell when a data write operation is commanded by said first control signal.

2. The semiconductor memory device according to claim 1, further comprising a delay circuit which delays said first control signal to generate said second control signal.

3. The semiconductor memory device according to claim 1, further comprising a control circuit generating circuit which generates and outputs said second control signal when a data write operation is commanded by said first control signal and said data write operation is performed to accumulate charge in said floating gate by said data to be written into said selected memory cell.

4. A semiconductor memory device comprising:
plural word lines;
plural drain lines;
plural source lines;
a memory array including plural memory cells formed from a field effect transistor having a gate, a drain, a source and a floating gate, said gate of each of said plural memory cells being connected to any of said plural word lines, said drain of each of said plural memory cells being connected to any of said plural drain lines, said source of each of said plural memory cells being connected to any of said plural source lines;
a data write circuit which receives a control signal and write data and supplies a source drive voltage to said source line when data is written into said memory cell;
a write control circuit which receives said control signal and supplies a drain drive voltage based on said control signal to said drain line when data is written into said memory cell; and
a word line drive circuit which receives an address signal and said control signal and supplies a word line drive voltage based on said second control signal to a word line selected according to said address signal; wherein
said write control circuit outputs said drain drive voltage at a high level for data write via said drain line to said memory cell selected by said word line drive circuit when a data write operation is commanded by said control signal, and outputs said drain drive voltage at a low level when a data write operation is not commanded by said control signal, and
said data write circuit generates a write voltage corresponding to a logical value of data to be written into said selected memory cell based on said drain drive voltage outputted from said write control circuit, and supplies said write voltage as said source drive voltage via said source line to said selected memory cell when a data write operation is commanded by said first control signal.

5. The semiconductor memory device according to claim 4, wherein said data write circuit includes:
a first transistor connected between a first output node of said write control circuit and a second output node which outputs said write voltage;
a second transistor connected between ground voltage and said second output node, conduction state of said second transistor being controlled by a signal according to a logical value which is an inverse of said logical value of said data to be written; and
a third transistor connected between ground potential and said second output node, conduction state of said third transistor being controlled by a signal according to said logical value of said data to be written.

6. A semiconductor memory device comprising:
plural word lines;
plural drain lines;
plural source lines;
a memory array including plural memory cells formed from a field effect transistor having a gate, a drain, a source and a floating gate, said gate of each of said plural memory cells being connected to any of said plural word lines, said drain of each of said plural memory cells being connected to any of said plural drain lines, said source of each of said plural memory cells being connected to any of said plural source lines;
a data write circuit which receives a first control signal set to any of first and second control voltages and write data corresponding to any of first and second logical values, and supplies a source drive voltage based on said write data to said source line when data is written into said memory cell;
a write control circuit which receives a second control signal set to any of third and fourth control voltages, and supplies a drain drive voltage based on said second control signal to said drain line when data is written into said memory cell; and
a word line drive circuit which receives an address signal and said second control signal, and supplies a word line drive voltage based on said second control signal to said word line selected according to said address signal when data is written into said memory cell;

wherein, when data is written into said memory cell,
said first control signal is changed over from said first control voltage to said second control voltage, and said second control signal is changed over from said third control voltage to said fourth control voltage at a time which is later than a time at which said first control signal is changed over to said second control voltage,
said write control circuit sets said drain drive voltage to a first drive voltage when said second control signal is said third control voltage, and sets said drain drive voltage to a second drive voltage higher than said first drive voltage when said second control signal is said fourth control voltage,
said word line drive circuit sets said selected word line to a third drive voltage when said second control signal is said first control voltage, and sets said selected word line to a fourth drive voltage higher than said third drive voltage when said second control signal is said fourth control voltage, and
said data write circuit sets said source drive voltage to a voltage lower than said drain drive voltage from when said first control signal is changed over to said second control voltage to when said second control signal is changed over to said fourth control voltage, and sets said source drive voltage to any of a fifth drive voltage higher than said drain drive voltage and a sixth drive voltage lower than said drain drive voltage according to a logical value of said write data while said second control signal is said fourth control voltage.

7. A semiconductor memory device, comprising:
plural word lines;
plural drain lines;
plural source lines;
a memory array including plural memory cells formed from a field effect transistor having a gate, a drain, a source and a floating gate, said gate of each of said plural memory cells being connected to any of said plural word lines, said drain of each of said plural memory cells being connected to any of said plural drain lines, said source of each of said plural memory cells being connected to any of said plural source lines;
a data write circuit which receives a first control signal and write data corresponding to any of first and second logical values, and supplies a source drive voltage based on said write data to said source line when data is written into said memory cell;
a delay circuit which delays said first control signal set to any of first and second control voltages to generate a second control signal;
a write control circuit which receives a second control signal set to any of third and fourth control voltages, and supplies a drain drive voltage based on said second control signal to said drain line when data is written into said memory cell; and
a word line drive circuit which receives an address signal and said second control signal, and supplies a word line drive voltage based on said second control signal to said word line selected according to said address signal when data is written into said memory cell;
wherein, when data is written into said memory cell,
said write control circuit sets said drain drive voltage to a first drive voltage when said second control signal is said third control voltage, and sets said drain drive voltage to a second drive voltage higher than said first drive voltage when said second control signal is said fourth control voltage,
said word line drive circuit sets said selected word line to a third drive voltage when said second control signal is said third control voltage, and sets said selected word line to a fourth drive voltage higher than said third drive voltage when said second control signal is said fourth control voltage, and
said data write circuit sets said source drive voltage to a voltage lower than said drain drive voltage from when said first control signal is changed over to said second control voltage to when said second control signal is changed over to said fourth control voltage, and sets said source drive voltage to any of a fifth drive voltage higher than said drain drive voltage and a sixth drive voltage lower than said drain drive voltage according to a logical value of said write data while said second control signal is said fourth control voltage.

8. A semiconductor memory device, comprising:
plural word lines;
plural drain lines;
plural source lines;
a memory array including plural memory cells formed from a field effect transistor having a gate, a drain, a source and a floating gate, said gate of each of said plural memory cells being connected to any of said plural word lines, said drain of each of said plural memory cells being connected to any of said plural drain lines, said source of each of said plural memory cells being connected to any of said plural source lines;
a data write circuit which receives a first control signal set to any of first and second control voltages and write data corresponding to any of first and second logical values, and supplies a source drive voltage based on said write data to said source line when data is written into said memory cell;
a write control circuit which receives a second control signal set to any of third and fourth control voltages, and supplies a drain drive voltage based on said second control signal to said drain line when data is written into said memory cell;
a word line drive circuit which receives an address signal and said second control signal, and supplies a word line drive voltage based on said second control signal to said word line selected according to said address signal when data is written into said memory cell; and
a control signal generating circuit which changes over said second control signal to said fourth control voltage, when data is written into said memory cell, said first control signal is said second control voltage, and a charge is accumulated in said floating gate by data to be written into said selected memory cell; wherein
said write control circuit sets said drain drive voltage to a first drive voltage when said second control signal is said third control voltage, and sets said drain drive voltage to a second drive voltage higher than said first drive voltage when said second control signal is said fourth control voltage,
said word line drive circuit sets said selected word line to a third drive voltage when said second control signal is said third control voltage, and sets said selected word line to a fourth drive voltage higher than said third drive voltage when said second control signal is said fourth control voltage, and
said data write circuit sets said source drive voltage to a voltage lower than said drain drive voltage from when said first control signal is changed over to said second control voltage to when said second control signal is changed over to said fourth control voltage, and sets said source drive voltage to any of a fifth drive voltage higher than said drain drive voltage and a sixth drive voltage lower than said drain drive voltage according to a logical value of said write data while said second control signal is said fourth control voltage.

9. A semiconductor memory device comprising:

plural word lines;

plural drain lines;

plural source lines;

a memory array including plural memory cells formed from a field effect transistor having a gate, a drain, a source and a floating gate, said gate of each of said plural memory cells being connected to any of said plural word lines, said drain of each of said plural memory cells being connected to any of said plural drain lines, said source of each of said plural memory cells being connected to any of said plural source lines;

a data write circuit which receives a control signal set to any of first and second control voltages and write data corresponding to any of first and second logical values, and supplies a source drive voltage based on said write data to said source line when data is written into said memory cell;

a write control circuit which receives said control signal, and supplies a drain drive voltage based on said control signal to said drain line when data is written into said memory cell; and a word line drive circuit which receives an address signal and said control signal, and supplies a word line drive voltage based on said control signal to said word line selected according to said address signal when data is written into said memory cell;

wherein, when data is written into said memory cell, said control signal changes over from said first control voltage to said second control voltage;

said write control circuit sets said drain drive voltage to a first drive voltage when said control signal is said first control voltage, and sets said drain drive voltage to a second drive voltage higher than said first drive voltage when said control signal is said second control voltage, said word line drive circuit sets said selected word line to a third drive voltage when said control signal is said first control voltage, and sets said selected word line to a fourth drive voltage higher than said third drive voltage when said control signal is said second control voltage, and said data write circuit generates a write voltage corresponding to said logical value of said data to be written into said selected memory cell using said drain drive voltage outputted from said write control circuit when said source drive voltage is changed over to said second control voltage of said control signal, and supplies said write voltage as said source drive voltage to said selected memory cell via said source line.

* * * * *